United States Patent [19]

Morrison, Jr.

[11] 4,361,472
[45] Nov. 30, 1982

[54] SPUTTERING METHOD AND APPARATUS UTILIZING IMPROVED ION SOURCE

[75] Inventor: Charles F. Morrison, Jr., Boulder, Colo.

[73] Assignee: Vac-Tec Systems, Inc., Boulder, Colo.

[21] Appl. No.: 264,551

[22] Filed: May 18, 1981

Related U.S. Application Data

[63] Continuation-in-part of Ser. No. 187,140, Sep. 15, 1980.

[51] Int. Cl.³ .............................................. C23C 15/00
[52] U.S. Cl. ........................... 204/192 R; 204/192 E; 204/298
[58] Field of Search ................ 204/298, 192 R, 192 E

[56] References Cited

U.S. PATENT DOCUMENTS

| | | | |
|---|---|---|---|
| 3,878,085 | 4/1975 | Corbani | 204/192 R |
| 4,100,055 | 7/1978 | Rainey | 204/192 R |
| 4,116,806 | 9/1978 | Love | 204/298 |
| 4,162,954 | 7/1979 | Morrison | 204/192 R |
| 4,180,450 | 12/1979 | Morrison | 204/192 R |
| 4,194,962 | 3/1980 | Chambers | 204/298 |
| 4,219,397 | 8/1980 | Clarke | 204/298 |
| 4,239,611 | 12/1980 | Morrison | 204/192 R |
| 4,265,729 | 5/1981 | Morrison | 204/298 |
| 4,277,304 | 7/1981 | Horiike et al. | 204/298 |
| 4,312,731 | 1/1982 | Morrison | 204/298 |

OTHER PUBLICATIONS

John A. Thornton, J. Vac. Sci. Technol. J., 15(2), Mar.-/Apr. 1978, pp. 171–177.

*Primary Examiner*—Veronica O'Keefe
*Attorney, Agent, or Firm*—Gerald J. Ferguson, Jr.; Joseph J. Baker; C. Lamont Whitham

[57] ABSTRACT

Method and apparatus for sputtering an element with a magnetron plasma source where a plasma is formed between two electrostatic field defining surfaces of the source and a generator anode disposed adjacent the plasma ejects it toward the element to be sputtered. Various applications are described including selective coating of substrates of different electrical conductivity, substrate cleaning, ion milling, retrieval of expensive or dangerous coating materials, heating with little loss in the heat source, sputtering with reactive ions, sensitization or charge neutralization, and pumping of active gases.

25 Claims, 64 Drawing Figures

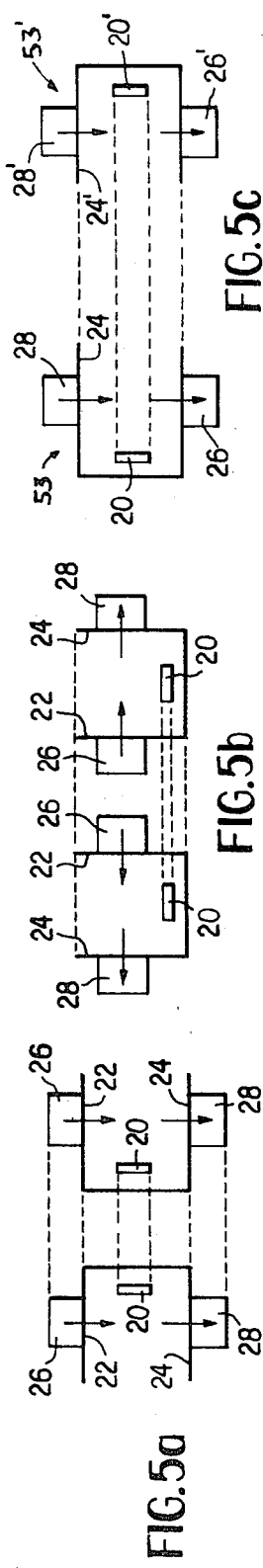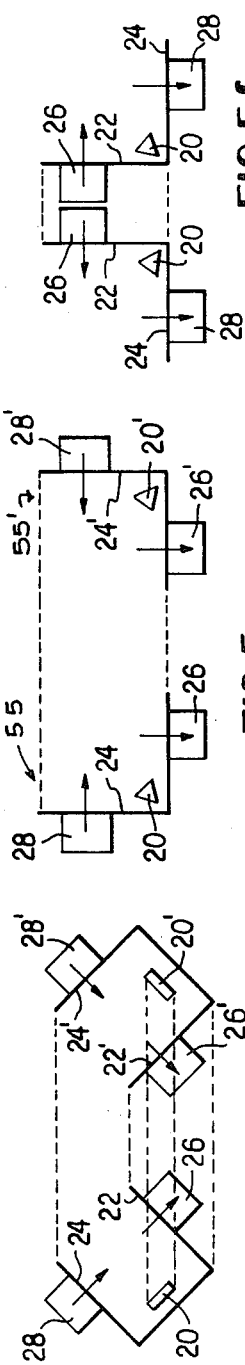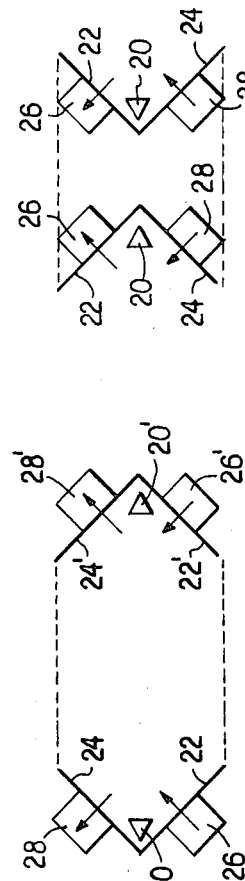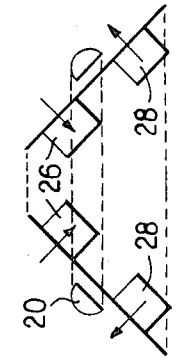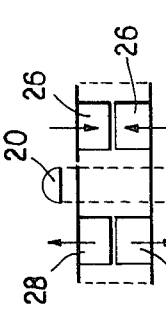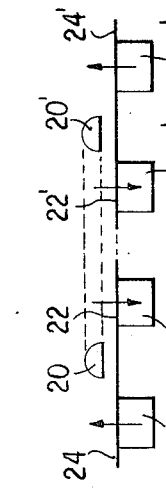

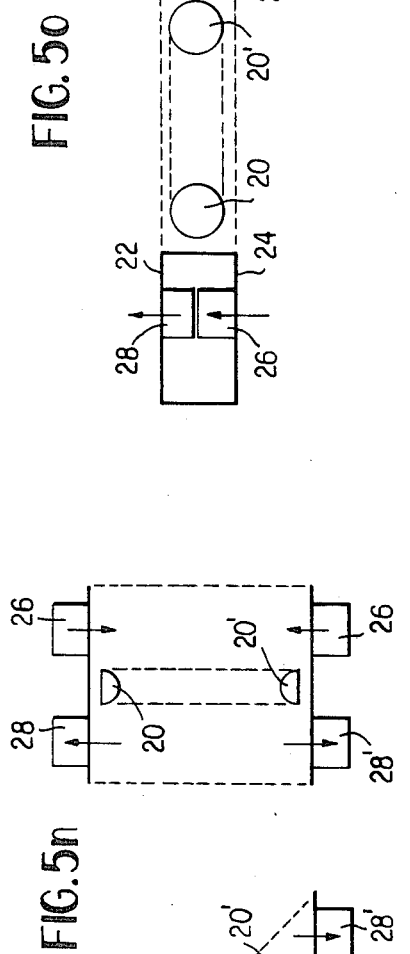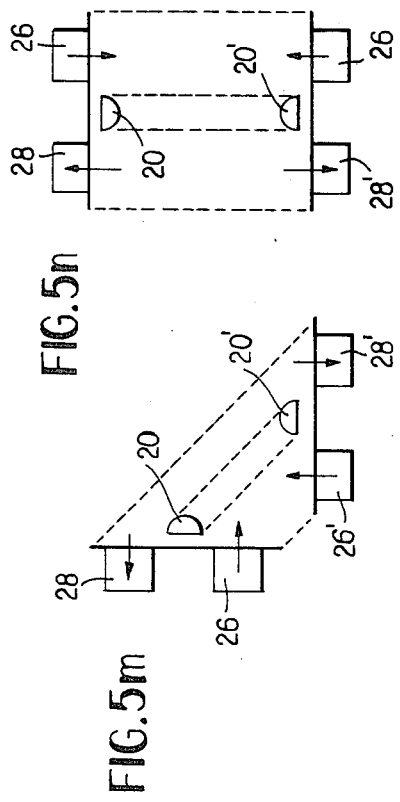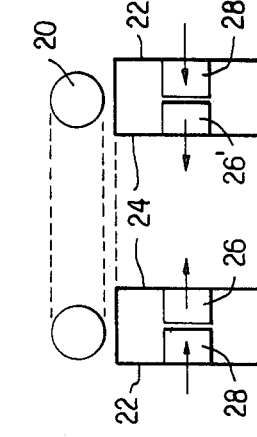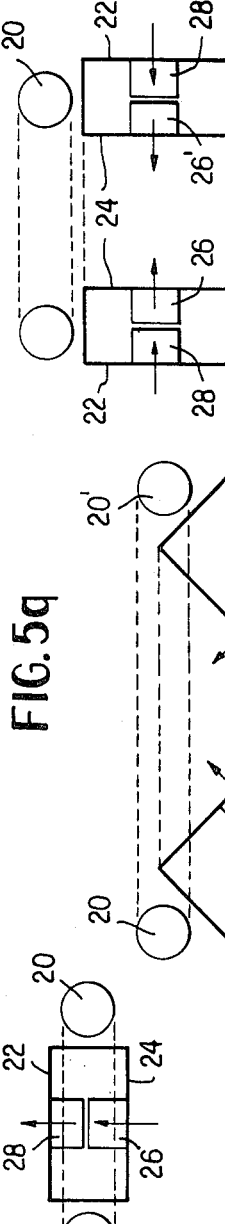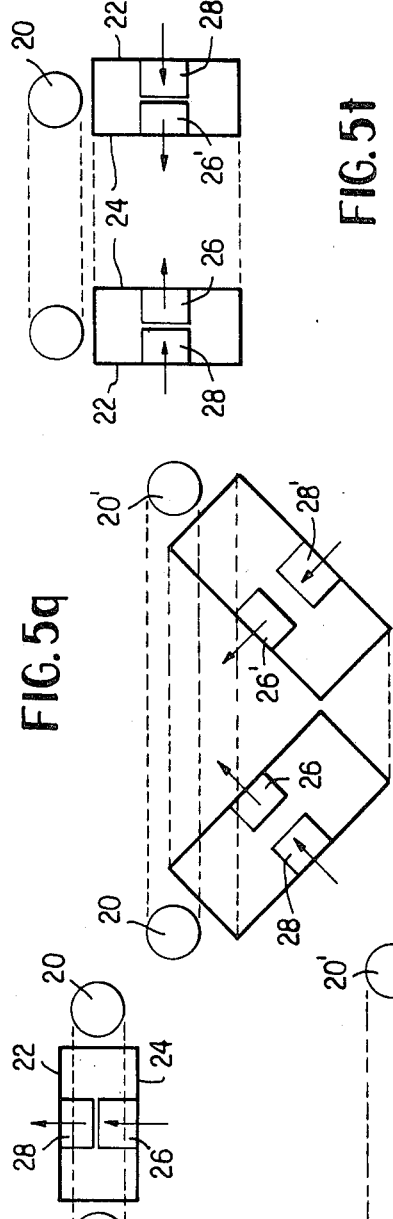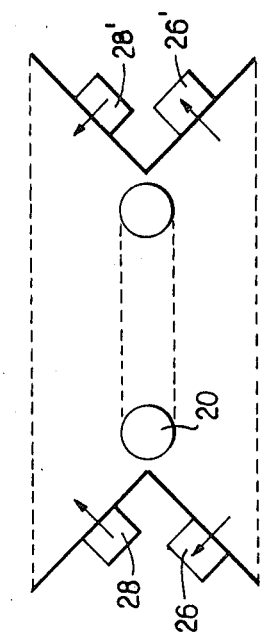

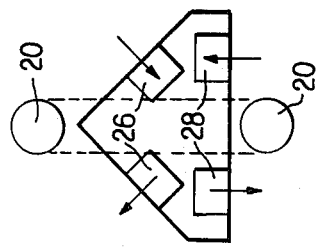
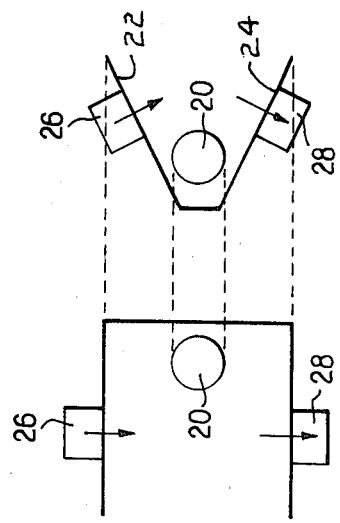
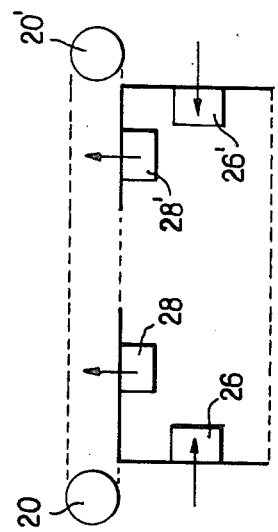
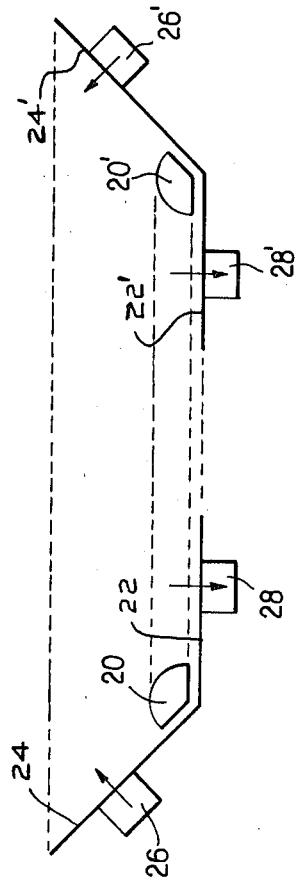
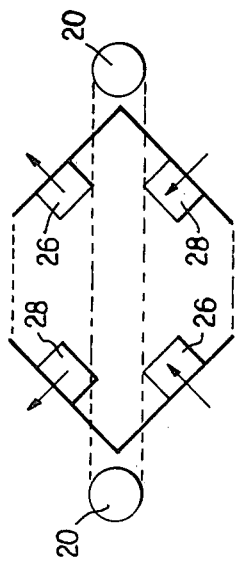

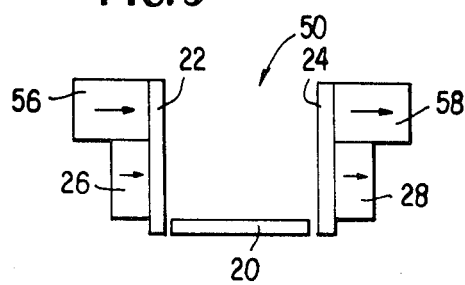
FIG. 9
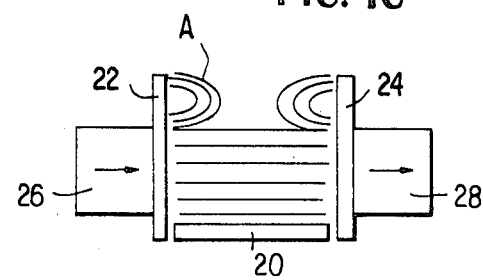
FIG. 10
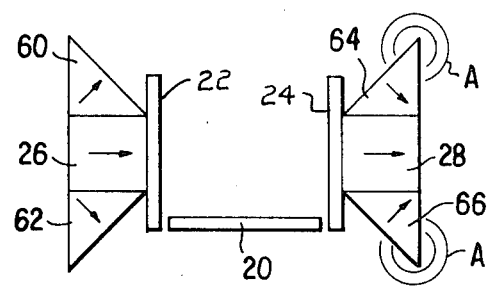
FIG. 11
FIG. 12a
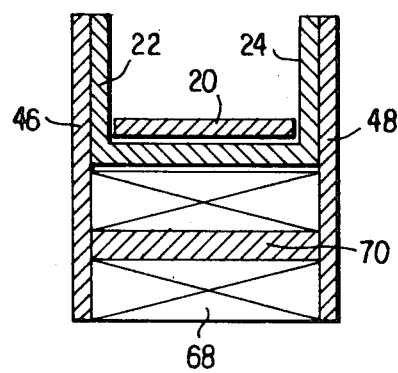
FIG. 12b
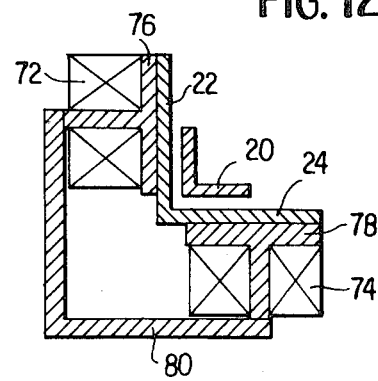
FIG. 12c
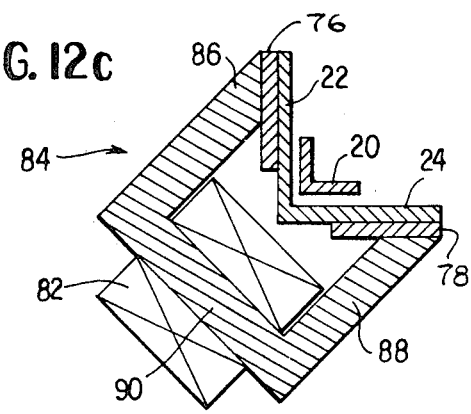
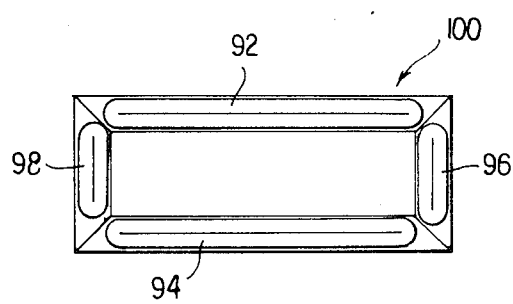
FIG. 12d FIG. 19
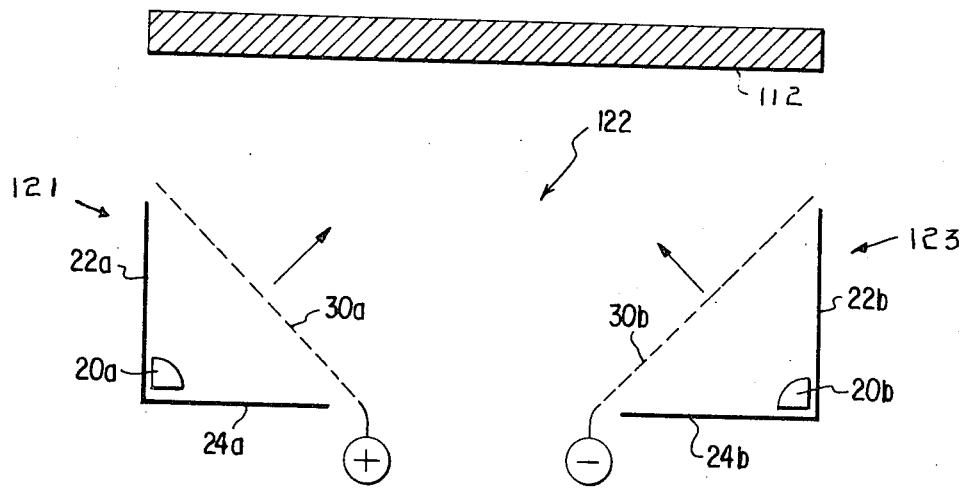
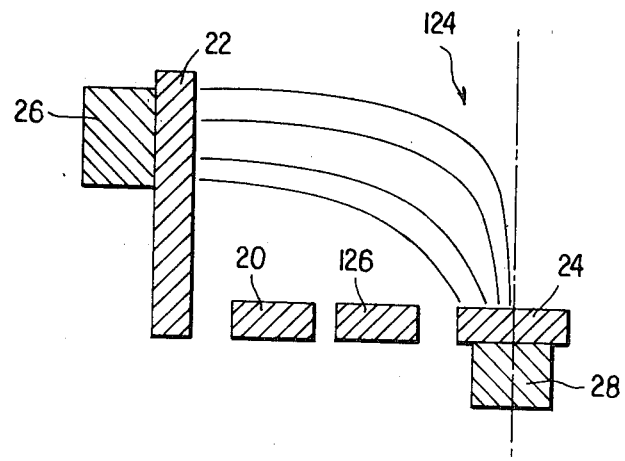
FIG. 20

SPUTTERING METHOD AND APPARATUS UTILIZING IMPROVED ION SOURCE

REFERENCE TO RELATED APPLICATION

This application is a Continuation-In-Part of U.S. Patent Application Ser. No. 187,140, filed Sept. 15, 1980.

BACKGROUND OF THE INVENTION

This invention relates to sputtering methods and apparatus where a separate plasma source or the like may be employed and to various methods utilizing plasma sources.

In certain known sputtering systems where separate ion sources are utilized, the ion sources possess serious current density limitations and are not most effectively applicable over a range of gas pressures generally employed in the most desired sequences of vacuum processing, cleaning and coating operations. These problems and others associated with the prior art are avoided in the present invention in accordance with the following objects thereof.

OBJECTS OF THE INVENTION

It is an object of this invention to provide an improved sputtering method and apparatus utilizing an improved magnetron plasma source.

It is a further object of this invention to provide an improved magnetron plasma source.

It is a further object of the present invention to provide improved methods, all of which may utilize the foregoing magnetron plasma source such as selective coating of substrates of different electrical conductivity, substrate cleaning, retrieval of expensive or dangerous coating materials, heating with little loss in the heat source, sputtering with reactive ions, sensitization or charge neutralization, and pumping of active gases.

Other objects and advantages of this invention will be apparent from a reading of the following specification and claims taken with the drawing.

BRIEF DESCRIPTION OF THE DRAWING

FIGS. 5(a)–5(w) and 6(a) and 6(b) are diagrammatic illustrations of plasma sources indicating various embodiments for establishing a closed plasma loop therein.

FIG. 9 is a diagrammatic illustration indicating the generation of different strength magnetic fields in a plasma source.

FIG. 10 is a diagrammatic illustration indicating the formation of undesired closed magnetic field loops in a plasma source.

FIG. 11 is a diagrammatic illustration of an illustrative plasma source for avoiding the problem illustrated by FIG. 10.

FIGS. 12(a)–12(d) are cross-sectional views illustrating the use of electro-magnets in the plasma source.

FIG. 19 is a diagrammatic illustration of an illustrative embodiment for sputtering a non-conductive target utilizing only D.C. power supplies.

FIG. 20 is a cross-sectional view of an illustrative combined plasma/sputter source.

DETAILED DESCRIPTION OF PREFERRED EMBODIMENTS OF THE INVENTION

Figure 1:
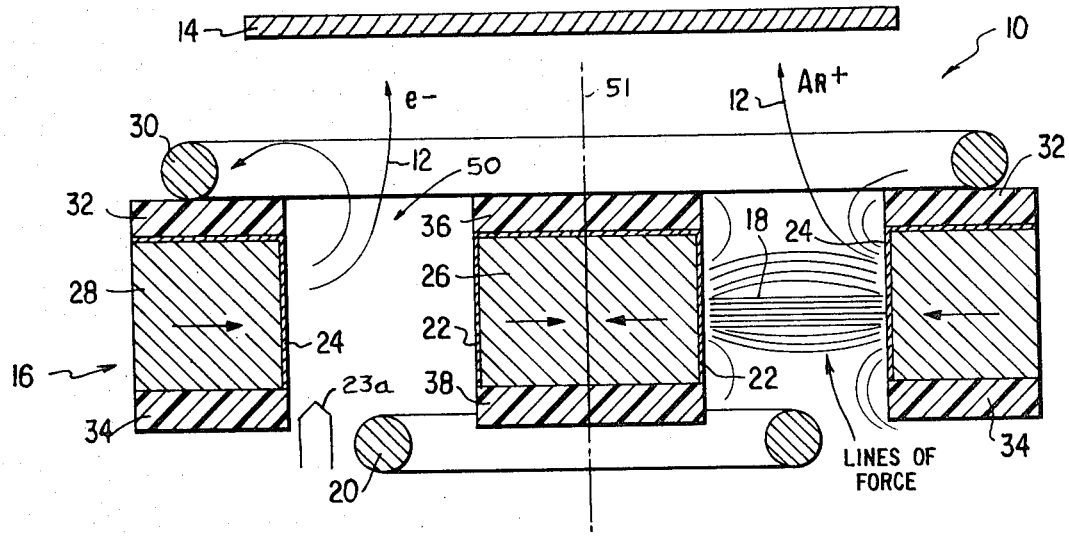
FIG. 1 is a cross-sectional view of an illustrative ion source in accordance with the invention.

Reference should be made to the drawing where like reference numerals refer to like parts.

Referring to FIG. 1, there is illustrated in cross-section a sputter ion source 10 in accordance with the invention which ejects positively charged ions (+ ions hereinafter) indicated at 12. The cross-sectional view in this embodiment, as in the other embodiments of the invention, may be of either a circular source or of an oval or rectangular source. The ions 12 may be directed at an element 14 which may be a substrate(s) which is to be cleaned or a target(s) which is to be sputtered or etched. These and other applications will be discussed in more detail hereinafter.

Ion source 10 includes a magnetron-type plasma source 16 which produces a plasma indicated at 18 where the plasma may be that of an inert gas such as argon, an active gas such as oxygen or nitrogen or a mixture of gases and where the pressure is very low as is typical in such applications. In magnetron-type devices, crossed electric and magnetic fields are provided which enhance the ionization of a low pressure gas such as argon as is well known in connection with magnetron sputtering devices. The electric field is established between a generator anode 20 (which may be tubular to permit the circulation of a coolant therethrough) and a generator cathode comprising cylindrical surfaces 22 and 24. The magnetic field is established by inner and outer magnet rings 26 and 28 which may either be permanent magnets or electro-magnets, as will be further discussed below. The direction of the lines of flux within magnets 26 and 28 may be as indicated by the arrows, arrows also being used for this purpose in the other figures of the drawing.

Due to the disposition of anode 20 to one side of plasma 18, the plasma is ejected from the open end 50 of source 16. This structure may be called an "inverse magnetron". The conventional magnetron traps electrons close to the cathode using a crossed magnetic and electric field. In the inverse magnetron, the electrons are trapped close to the anode by this same mechanism. In both cases, these trapped electrons are given extended opportunity to create + ions by colliding with gas molecules. In the conventional magnetron, the ions can be drawn away by the potential and accelerated across the voltage gradient into the cathode surface. As the trapped electrons lose energy from their ionization encounters, they become less firmly bound by the crossed field and are eventually lost into the system plasma and to the anode. In the inverse magnetron, the electrons are free to move away from the cathode, their point of origin in most cases, but are cross-field trapped close to the anode. Ions created by electron-gas molecule collisions are thus created very close to the anode and are therefore violently repelled from the anode. The exit from the source is opposite the anode, permitting these ions to escape.

A collector electrode 30 may be disposed adjacent the open end of the source, it being positively biased to extract electrons from the plasma so that a + ion enriched stream of charged particles is ejected from source 10. Conversely, negative biasing of collector electrode 30 strips + ions from the ejected plasma to thereby convert source 10 to an electron source. Non-connection or removal of electrode 30 leaves the ejected plasma unaffected. Electrical isolation of cathodes 22 and 24 from electrode 30 and other biased surfaces is effected by insulators 32-38.

There will be little, if any, sputtering of generator cathode surfaces 22 and 24 since the lines of magnetic force are substantially perpendicular to these surfaces. Generally, at least a majority of the lines of force should be at angles of 45° or more if sputtering of these surfaces is not desired. Sputtering can also be lessened by employing carbon or carbon-compound materials or the like. Oxide coatings may also be provided to enhance electron emission from the cathode surfaces to enhance plasma formation.

Figures 2A, 2B, 2C:
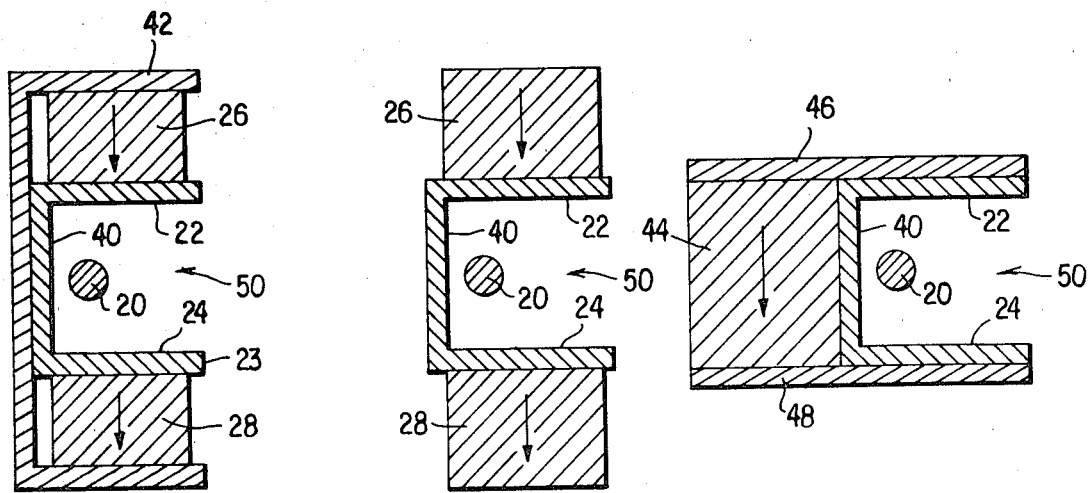
FIGS. 2(a)–2(c) are cross-sectional views of illustrative plasma sources in accordance with the invention.

In the embodiments of FIGS. 2(a)-2(c), generator cathode 23 comprises cathode surfaces 22 and 24 which are connected by a plate 40. Generator anode 20 is disposed in the center of the cathode so that it substantially shields those areas of plate 40 where the lines of magnetic force are other than perpendicular. Hence, sputtering of the plate 40 is also substantially avoided. Accordingly, plasma is ejected from the open end 50 of the cathode, as in the FIG. 1 embodiment due to the disposition of the anode to one side of the plasma. A collector electrode (not shown) may strip either electrons or + ions from the plasma as discussed above with respect to collector electrode 30.

In FIG. 2(a), a magnetically permeable frame 42 is employed which may be helpful in preventing the formation of closed magnetic loops over surfaces 22 and 24 which would thereby tend to sputter these surfaces. As indicated in FIG. 2(b), frame 42 is optional. In FIG. 2(c), a single magnet 44 together with magnetically permeable frame pole pieces 46 and 48 provide the requisite field which is substantially perpendicular to the cathode surfaces 22 and 24.

In the embodiments of FIGS. 1 and 2, cathode surfaces 22 and 24 face one another. This is diagrammically indicated in FIG. 3(a). In particular, the angle between cathode surfaces 22 and 24 is indicated as 0°. As illustrated in FIGS. 3(a)-3(e), the angle between the cathode surfaces may vary between 0° and 360°. FIGS. 3(b)-3(e) respectively illustrate angles of 90°, 180°, 270° and 360° between the cathode surfaces, it being understood any other angle may also be employed. In the configurations of FIG. 3, the open end 50 of the plasma source widens so that in the embodiments of FIGS. 3(b)-3(e), the plasma is immediately ejected over a wide angular range.

Figure 3A:
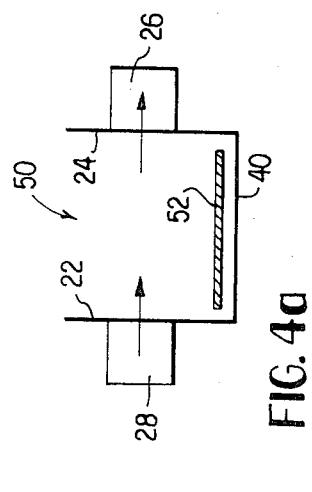
FIGS. 3(a)–3(e) and 4(a)–4(c) are diagrammatic illustrations of plasma sources illustrating different opening angles thereof.
Figure 3B:
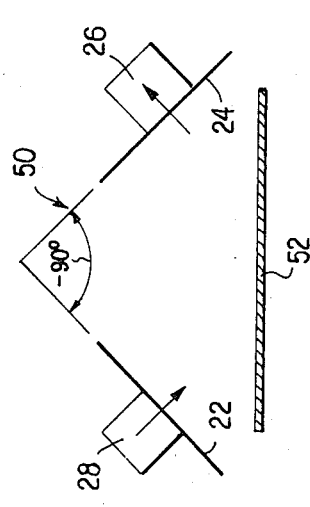
Figure 3D:
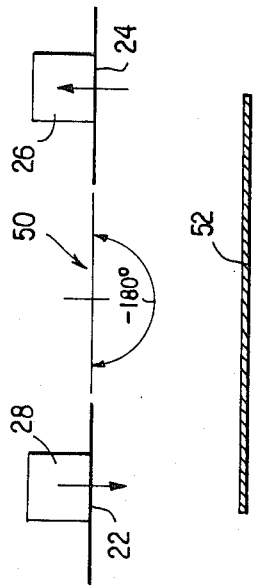
Figure 3C:
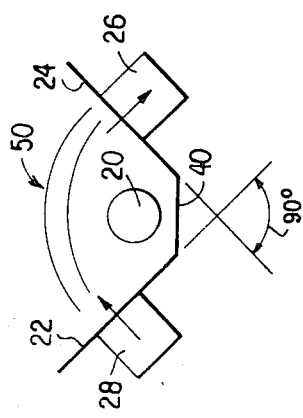
Figure 3E:
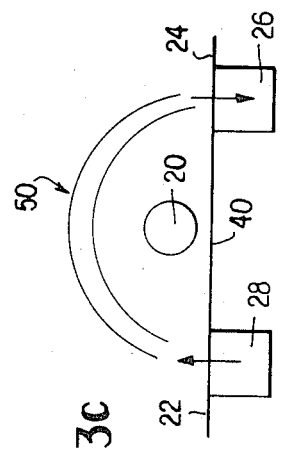
Figure 4A:
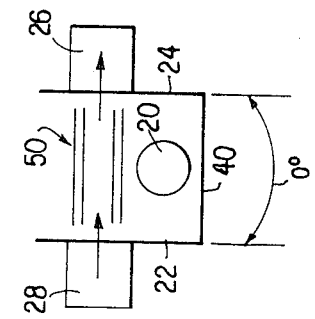
Figure 4B:
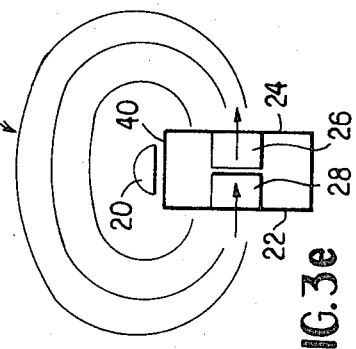
Figure 4C:
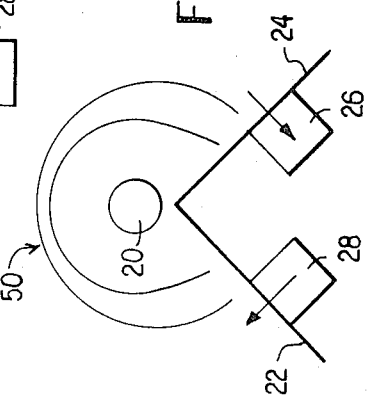

As illustrated in FIGS. 4(a)-4(c), the angle between the cathode surfaces 22 and 24 may also be varied through negative angles from 0° through −360°, the configurations of −90° and −180° being illustrated in FIGS. 4(b) and 4(c). Also note generator anode 52 which comprises a plate as opposed to the tubular generator anode 20 of the FIG. 3 embodiments. In some instances, generator anode 52 is more effective in preventing sputtering of plate 40 since it more completely covers the surface of this plate as indicated in FIG. 4(a).

In the description of FIGS. 1, 2, 3 and 4, the cathode surfaces 22 and 24 have both been assumed to be conductive and electrically connected. However, it is possible to replace one cathode surface with an insulator or a conductive surface insulated from both anode and cathode. With such a structure when discharge is started, the device saturates at a slightly lesser power level than before, but is otherwise unaffected. Because electrons are free to move along magnetic field lines, they flow from the real cathode surface to this insulated "psuedo cathode" surface until the latter receives sufficient negative charge to reject further electron flow. The potential at which this occurs is essentially that of the real cathode surface. This automatically charged "pseudo cathode" surface is not connected to the power system and so is not a cathode in the real sense, yet it serves as a negatively charged boundary for further electron flow. It is possible to extend the principles of the "pseudo cathode". If there is an alternate electron source such as a filament 23a or a beta particle source, the ion/plasma output could be maintained with only the electron source as the true generator cathode, i.e. both cathode surfaces 22 and 24 would be "pseudo cathode" surfaces. Such surfaces can establish the electrostatic aspects of the crossed field, but cannot serve the electron supply function of the cathode.

In the embodiment of FIG. 1, a closed loop plasma path is indicated in that the plasma circulates around the ring-shaped (or oval-shaped) plasma source 16 in a plane substantially parallel to the plane of generator anode 20 where plasma to the left of the plane of symmetry indicated by imaginary line 51 moves into (or out of) the plane of the drawing between cathode surfaces 22 and 24 while on the other side of the loop to the right of plane 51, plasma moves out of (or into) the plane of the drawing once again between the cathode surfaces 22 and 24. In the configurations of FIGS. 2, 3 and 4, there are illustrated cross-sections of the plasma source which may correspond to the left (or right) half of the FIG. 1 configuration. That is, provision may be made to complete the plasma loops of the FIGS. 2-4 configurations as is indicated in FIG. 1. By completing the plasma loop configurations, the loss of ionizing electrons produced by generator cathode 23 is minimized and thus, the efficiency of the source is enhanced. However, in appropriate situations, a strip source, the cross-section of which is, for example, illustrated by the configurations of FIGS. 2-4, wherein the plasma loop is not closed, may be utilized.

In FIGS. 5(a)-5(v), there are illustrated various configurations which illustrate how a closed plasma loop may be effected. Thus, in the embodiments of FIGS. 5(a)-5(d), the cathode surfaces are at 0° with respect to one another and correspond to the FIG. 3(a) embodiment. In FIG. 5(a), the opposite legs of the source are directed away from one another while in FIG. 5(b), they are upwardly directed and in FIG. 5(c) they are directed to one another and in FIG. 5(d) they are inclined toward one another.

It should be noted with respect to FIGS. 5(c) and 5(d) that the circular ends of oval-shaped plasma sources may be removed. That is, two separate strip sources may be employed. Thus, referring to FIG. 5(c), one of the strip sources 53 has the elements thereof indicated by unprimed reference numerals while the elements of the other strip source 53' are indicated by primed reference numerals. It appears the plasma from source 53 is partially fed to source 53' and vice versa. This cross-feeding of the plasma appears to result in a plasma loop which is formed in the plane of the drawing. Accordingly, the efficiency of the FIG. 5(c) configuration remains substantially the same whether or not the ends of the strip sources 53 and 53' are joined to provide an oval-shaped source. In general, it is only necessary that part of the plasma from one strip source (or channel) flow to the other strip source (or channel).

With respect to plasma source 53, anode 20' of source 53' acts as an electron collector as does anode 20 for source 53'. Hence, the plasma ejected from sources 53 and 53' is + ion rich. The foregoing remarks apply whenever strip sources face one another. Typical configurations where separate strip sources may face one another are also indicated in the remaining embodiments of FIG. 5 by employing unprimed reference numerals for one side of the source and primed reference numerals for the other side of the source. If separate strip sources are employed, the dotted lines connecting the opposite sides of the source as shown in the foregoing embodiments would not appear.

Referring to FIGS. 5(e)-5(i), there are shown different plasma sources which illustrate how the plasma loop may be closed with the 90° source of FIG. 3(b). FIG. 5(e) illustrates a preferred embodiment for generating a + ion rich plasma. It should be noted that as ions are ejected from source 55 of FIG. 5(e), some of these ions will be directed toward the cathode surfaces 22' and 24' of source 55' to sputter the latter surfaces. As will be described hereinafter, sputtering of these surfaces in some instances may be desirable. However, if sputtering is to be avoided, the configuration of FIG. 5(g) would be more preferable.

Referring to the embodiments of FIGS. 5(j)-5(n), there are illustrated various embodiments for closing the plasma loop of FIG. 3(c), while FIGS. 5(o)-5(r) illustrate various embodiments for closing the plasma loop of the FIG. 3(e) source and FIGS. 5(s)-5(v) illustrate various embodiments for closing the plasma loop of the FIG. 3(d) embodiment. FIG. 5(w) illustrates an embodiment for closing the plasma loop of a plasma source whose cathode surfaces 22 and 24 are disposed at an angle of 135° with respect to one another.

Hybrid configurations are also possible as indicated in FIGS. 6(a) and 6(b). Thus, FIG. 6(a) is a hybrid configuration where one leg of the closed loop corresponds to FIG. 3(d) and the other to FIG. 3(b) while in FIG. 6(b) one leg corresponds to FIG. 3(a) and the other to a leg where the cathode surfaces 22 and 24 are disposed at an angle of approximately 60° with respect to one another.

Figure 7A:
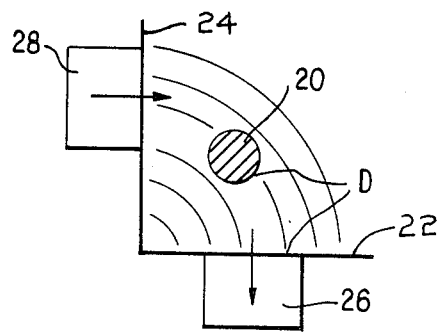
FIGS. 7(a)–7(d) are diagrammatic illustrations showing factors relative to heating of the generator anode of a plasma source.
Figure 7B:
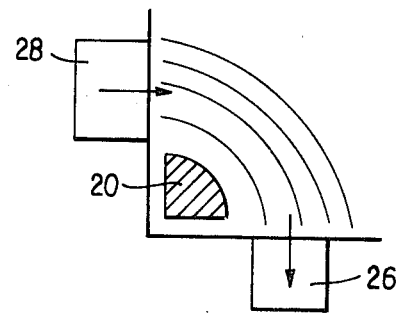
Figure 7C:
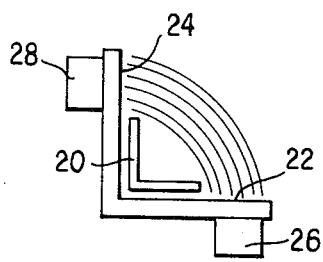
Figure 7D:
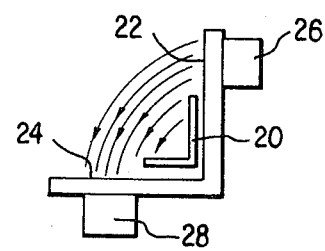

In those embodiments of the invention where little, if any, sputtering of the generator cathode 23 occurs, there is very little heating of the cathode. Heating of the generator anode can also be minimized. Anode heating typically results from it being struck by energetic electrons. In a crossed field device this may imply the magnetic field is not adequately trapping the electrons. If the magnetic field is sufficiently strong, the problem can usually be traced to lines of force which start at the cathode and end at the anode as indicated at D in FIG. 7(a). Thus, where the emitted electron is free to move along a line of force, limited only by electrostatics, it is readily accelerated from cathode to anode. This almost immediate electron loss prevents those electrons from being effective plasma generators, and dumps their energy into the anode. As indicated in FIGS. 7(b) and 7(c), this problem may be lessened by shaping and/or locating the anode such that it does not intercept lines of force from the cathode except at very short distances. In these figures, the lines of force which strike the anode travel preferably no more than approximately 1/16" from the cathode and generally no more than 1/8" from the cathode. In FIG. 7(d), there is also heating caused by electrons that can move along the arrowed path 22' from cathode to anode following lines of force. An appropriately designed source employing the foregoing considerations has been tested and it has been demonstrated that an entire stainless steel vacuum chamber can be substantially heated without the source 16 becoming hot. The energy transfer efficiency thus indicated appears to be quite high. As will be further discussed with respect to FIG. 23, it appears items can be heated using the plasma source of the present invention with little loss of heat in the source.

Figure 8:
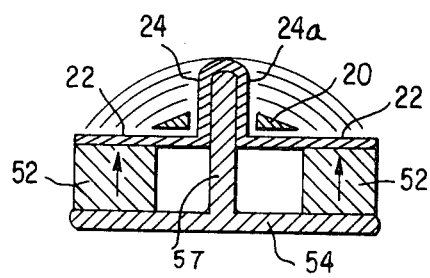
FIG. 8 is a cross-sectional view of a plasma source in accordance with the invention.

Referring to FIG. 8, there is shown an embodiment of the invention which incorporates the features of the embodiments of FIGS. 7(b) and 7(c) and which approximates the FIG. 5(f) configuration. In particular, ring or oval-shaped magnet 52 has the lower portion thereof coupled by a T-shaped magnetically permeable (steel, for example) coupler, the vertical leg 57 of which projects between cathode surfaces 24 and 24a. The magnetic lines of force are as indicated. Hence, FIG. 8 demonstrates that there are many further variations of the FIGS. 3-5 embodiments.

FIG. 9 also demonstrates variations which can be made with respect to the magnetics. Thus, in addition to magnets 26 and 28, magnets 56 and 58 may also be employed where the strength of the field produced by magnets 56 or 58 may be greater than or less than that produced by magnets 26 or 28 depending upon the application. No matter what the specific design of the magnetics, the crossed field keeps the generator electrons from reaching the anode until they have lost practically all their energy from colliding with gas atoms. The stronger the magnetic field, the higher the voltage electron that can be captured, and the lower the energy that the electron must reach in order to escape to the anode. The field strength that provides capture of the full energy electron (maximum desired operating voltage) and loses electrons to the anode only when they are no longer particularly efficient ionizers is the highest magnetic field that is desirable. A higher field can capture nothing further and will keep electrons too much beyond their prime, resulting in only an increase in space charge.

As indicated hereinbefore with respect to FIG. 2(a), the relationship of the magnets 26 and 28 of FIG. 10 and the cathode surfaces 22 and 24 may be such that closed magnetic loops as indicated at A may form, under which sputtering of cathode surfaces 22 and 24 can occur. The embodiment of FIG. 2(a) will tend to correct this as will that of FIG. 11 where the outer portions of the magnets 26 and 28 are shaped as indicated at 60-66 to produce the closed fields A away from over the cathode surfaces 22 and 24.

As indicated hereinbefore, the magnetic field of the ion source may be generated by permanent magnets or electro-magnets. FIGS. 12(a)-12(d) indicate different configurations wherein electro-magnets are employed. Thus, in FIG. 12(a), which generally corresponds to FIG. 2(c), the magnetically permeable pole plates 46 and 48 are disposed at opposite ends of electro-magnet 68 which is wound on magnetically permeable spindle 70.

The embodiments of FIGS. 12(b) and 12(c) generally correspond to FIG. 3(b) where in FIG. 12(b) electro-magnets 72 and 74 in contact with pole plates 76 and 78 to establish the ion source magnetic field and where the electro-magnets are coupled to each other via magnetically permeable, L-shaped coupling plate 80. In FIG. 12(c), electro-magnet 82 is coupled to plates 76 and 78 via U-shaped pole piece 84 which includes legs 86-90. Typically, the individual sides 92-98 of a picture-frame ion source 100 would be wound separately as indicated in FIG. 12(d). Many other embodiments employing electro-magnets can also accomplish the function of generating a magnetic field which loops across generator anode 20 and which enters and exits perpendicular to generator cathode surfaces 22 and 24 for each angle of opening between the cathode surfaces.

As indicated hereinbefore, sputtering or cleaning of element 14 of FIG. 1 are certain applications for which ion source 10 can be employed. These applications together with other applications of the ion, electron and plasma sources described hereinbefore will now be discussed in further detail.

As stated before, element 14 may either be a substrate(s) which is to be cleaned or a target(s) which is to be sputtered. It should be appreciated that the effect of releasing positive ions against a substrate is to sputter the substrate as if it were a target. Thus, the removal of a few monolayers of the substrate is an effective cleaning method. Of course, the ion source need not only be a cleaning tool. Thus, where the cleaning is sputtering, there is very little difference from using the source in conjunction with a sputter target. The principle differences are in orientation and electrical bias voltages as indicated in FIGS. 13-18. As can be seen from these figures, a non-sputtering, picture-frame, ion source is provided which can be used either as an ion source for cleaning substrates or as an ion source for effective sputtering of a target. Thus, in FIG. 13(a), there is illustrated apparatus for sputtering a target 102 via an ion source which corresponds to FIG. 5(b), the target 102 and the generator cathode 23 being negatively biased by D.C. power supply 104 with respect to generator anode 20 and electron collector electrode 30. Thus, + ions bombard the target to effect sputtering thereof. The generator anode may be at ground potential as indicated at 106 although in many applications it is preferred that it be above ground potential. The negative bias on the generator cathode 23 may be adjusted by variable resistor 108.

Figure 13A:
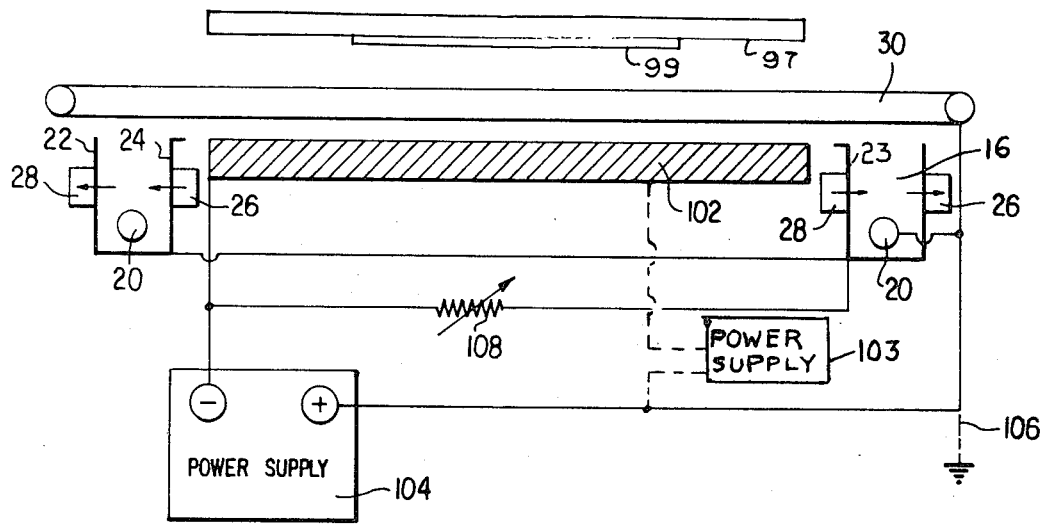
FIGS. 13–15 are diagrammatic illustrations of illustrative embodiments utilizing a plasma source for target sputtering.
Figure 14:
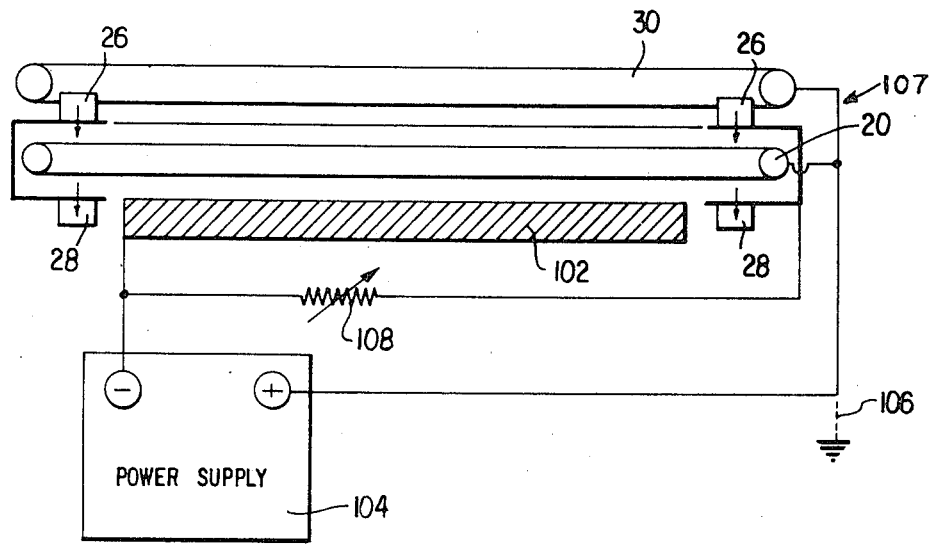
Figure 15:
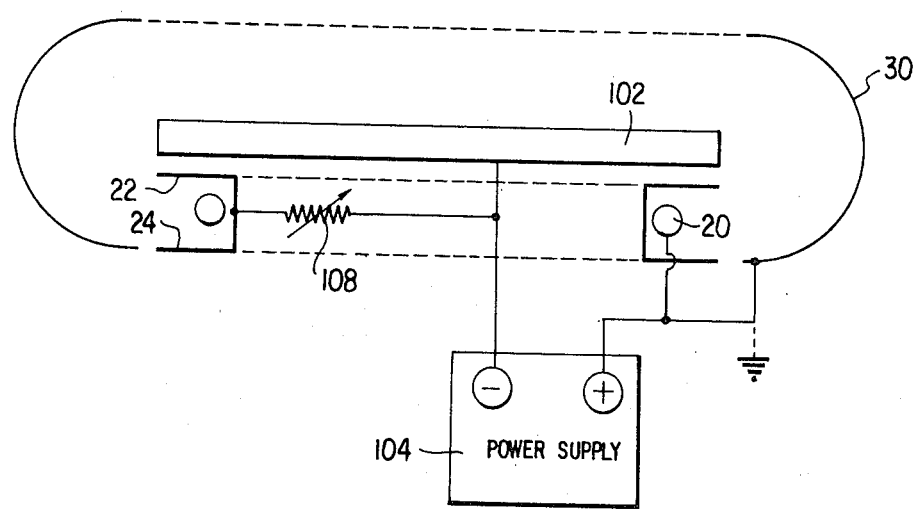

FIGS. 14 and 15 are similar to FIG. 13(a) except that the ion source of FIG. 14 corresponds to the embodiment of FIG. 5(c) while that of FIG. 15 corresponds to FIG. 5(a). Although there is some difference in the immediate directivity of the different ion sources of FIGS. 13-15, all of these sources will provide substantially the same constant uniformity of sputtering of the target 102. Further, even if the target is made of a magnetically permeable material, these sources can sputter the target since no magnetic field projects through the target.

Figure 16:
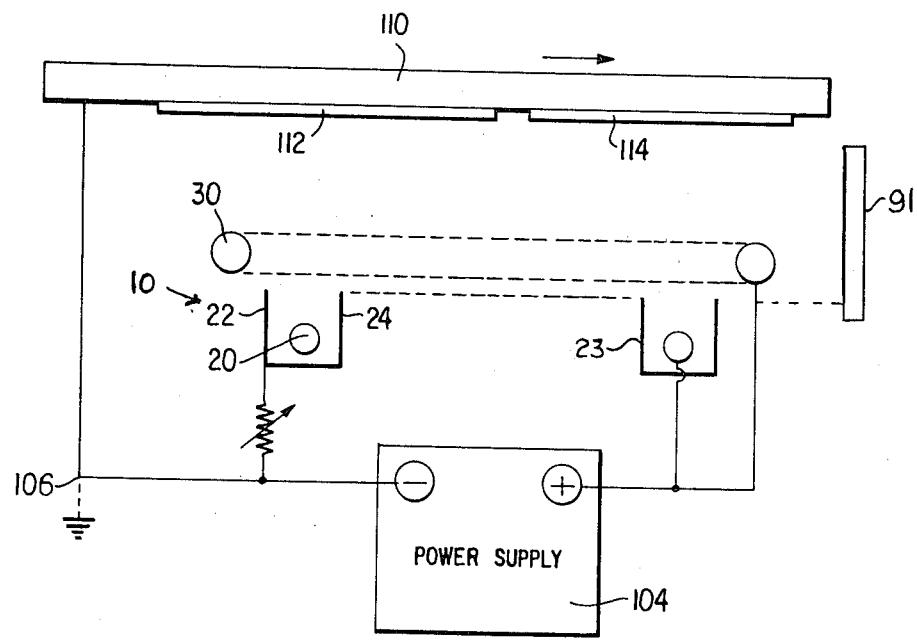
FIGS. 16 and 17 are diagrammatic illustrations of illustrative embodiments utilizing a plasma source for substrate cleaning.
Figure 17:
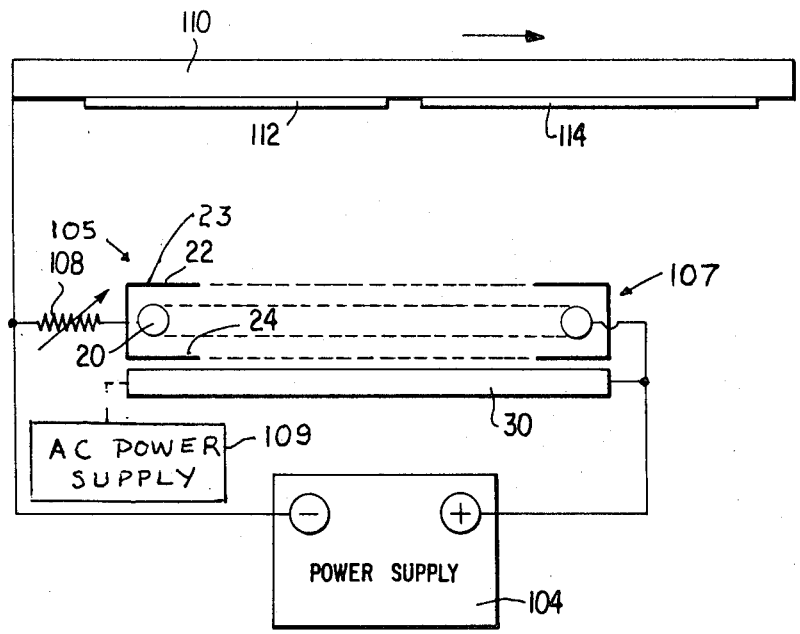

Referring to FIGS. 16 and 17, these are illustrated embodiments where the ion source is employed to clean substrates 112 and 114, the difference being the orientation of the sources. Typically, the substrates would be mounted on a holder 110 which may carry the substrates in the direction of the arrow. The generator cathode 23 and substrate holder 110 are negatively biased with respect to generator anode 20 and electron collector electrode 30 by D.C. power supply 104 where substrate holder 110 and the substrates 114 are conductive. However, as will be discussed in more detail hereinafter, the embodiments of FIGS. 16 and 17 with certain modifications may also be employed to clean non-conductive substrates. The foregoing also applies to the sputtering of non-conductive targets with the embodiments of FIGS. 13-15.

Figure 18:
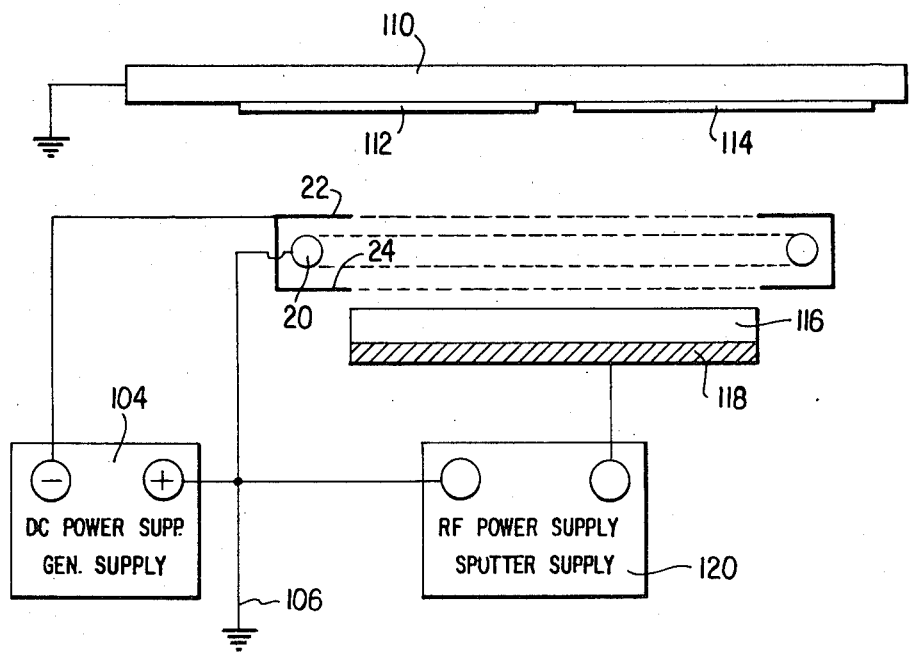
FIG. 18 is a diagrammatic illustration of an illustrative embodiment for sputtering of an electrically non-conductive target.

One embodiment of sputtering an electrically non-conductive substrate is illustrated in FIG. 18 where an RF power supply 120 drives a non-conductive substrate 116, the substrate being disposed on a conductive target holder 118. D.C. power supply 104 negatively biases generator cathode 22,24 with respect to grounded generator anode 20. The sputtered non-conductive material is deposited on substrates 112 and 114.

In general, the use of RF power supply 120 is disadvantageous and can be avoided as will be discussed below. However, it should first be generally remembered source 16 is fundamentally a plasma source. Thus, it is equally effective at providing electrons and + ions. It can be made an ion source by removing electrons from the plasma. In similar fashion, ions can be removed to project electrons. This is primarily a matter of driving the auxiliary collector electrode 30 with negative rather than positive D.C. power. This will then strip ions from the exiting plasma giving a net flow of electrons to the target or substrate.

If the target or substrate is a non-conductor, it would not be possible to effectively bombard it with positive ions only, for it would quickly charge to a sufficient voltage that no further ions could strike with force. However, if when charge saturation is approached, the polarity is reversed and electrons are projected, the positive charge is discharged and a negative charge is established. Polarity may then be again reversed, etc. In other words, an A.C. signal applied to auxiliary collector electrode 30 via A.C. power supply 109 (FIG. 17) in lieu of power supply 104 provides for effective bombardment of insulating substrates (or targets). Supply 104 would still be used to bias the generator anode 20. This embodiment is a significant improvement over the FIG. 18 embodiment in that applying A.C. or RF power to a moving substrate is difficult. Such A.C. or RF drive of fixed electrode 30 is much more effective.

In general, RF is less efficient and more difficult to apply than D.C. In addition, it typically requires sufficiently different argon pressure from that desired in other parts of most multi-step vacuum coating processes that it must be conducted behind closed locks. This adds significantly to the complexity and cost of the systems.

Most effective cleaning requires metal electrode backing for the insulator parts, making it difficult to clean complex shapes. As will be discussed below, the embodiment of FIG. 19 avoids the foregoing problems in that it provides sputter cleaning and sputtering coating of non-conductor materials using only D.C. sources.

The reason A.C. source 109 of FIG. 17 provides Ar+ impingement on non-conductive substrates 112 and 114 is the negative half cycle destruction of the + charge on the non-conductor surface. In the embodiment of FIG. 19, compound source 122 comprises electron source 121 and Ar+ source 123 whereby the destruction of + charge occurs simultaneously rather than sequentially as in FIG. 17. That is, the Ar+ ions are simultaneously directed with electrons to the non-conductor surface so that that surface cannot charge to a + value and reject the Ar+ ions.

To the degree that the Ar+ and electron beams overlap on the surface, sputtering of that surface is effected. Since both sources 121 and 123 are D.C., as are the auxiliary electrodes, cleaning and sputtering of non-conductor surface 122 is achieved without recourse to radio frequency power. In addition, no magnetics are associated with the substrate or the target—only with the source 122.

Assuming target 102 of the FIGS. 13 and 15 embodiments is electrically non-conductive and that the substrates 112 and 114 of the FIG. 16 embodiment are also non-conductive, these targets or substrates may be simultaneously bombarded with + ions and electrons by disconnecting the collector anode 30 from the power supply. In these embodiments, collector electrode 30 removes electrons from the ejected plasma due to the positive biasing of this electrode with respect to the generator cathode 23. By removing this positive bias on collector electrode 30, the ejected plasma remains electrically neutral with a substantially equal population of + ions and electrons. Thus, simultaneous destruction of positive charge build-up on non-conductive target 102 or non-conductive substrates 112 and 114 may be effected due to the simultaneous bombardment of these elements with the + ions and electrons of the ejected plasma. This ejected output from the sources of the FIGS. 14 and 17 embodiments will tend to be + ion rich even if the collector electrode 30 is disconnected from the power supply inasmuch as the ion source is inwardly directed in these embodiments. Especially if sources 105 and 107 are separate strip sources as discussed hereinbefore with respect to FIG. 5(c), the ejected output will be + ion rich. Accordingly, these embodiments tend not to be as suitable for ejecting a neutral plasma as are the embodiments of FIGS. 13, 15 and 16. However, sufficient negative bias on collector electrode 30 can bring about a neutral to negatively charged plasma output.

A number of the possible uses of the improved ion source of the present invention, including those discussed hereinbefore, will now be summarized and described.

1. Sputter Cleaning a. + Ion Bombardment

This application may employ an external collector electrode 30 as in the embodiment of FIG. 16 to remove electrons from the ejected plasma so that a net supply of + ions is provided. In the embodiment of FIG. 17, the collector electrode 30 may be disconnected from the power supply due to the fact that the ion sources face one another especially if they are two separate strip sources and yet a net supply of + ions is provided. Since the net supply of + ions is provided in the foregoing embodiments, the substrates 112 and 114 of FIG. 17 should be conductive and grounded or biased negatively to prevent positive charge build-up.

b. Plasma Bombardment

As indicated above, no collector electrode 30 is required to operate in this mode. Substrates 112 and 114 of FIG. 16 draw no net current and thus, they need not be electrically connected to anything. Thus, the substrates 112 and 114 may be electrically non-conductive or electrically conductive and electrically isolated from the power supply or electrically conductive and connected to the power supply.

2. Sputter Deposition a. + Ion Bombardment

The same considerations apply here with respect to FIGS. 13-15 as those mentioned above with respect to sputter cleaning by + ion bombardment. Generally, the source would be directed toward sputter cathode 102. However, this is not mandatory in that most, if not all, of the sources described hereinbefore are omni-directional although they tend to be omni-directional at points substantially removed from the source. In the embodiments of FIGS. 13-15, the same power supply 104 is used to bias both the generator cathode 23 and the target 102. However, a separate power supply 103 may be employed to provide an independent target bias. In this manner, the ion impact energy at the target can be controlled independently of the ion current ejected from the source. Similar considerations apply to the substrate cleaning embodiments of FIGS. 16 and 17 where a separate power supply may also be provided for substrates 112 and 114.

With respect to the sputtering of magnetically permeable targets, since there is no magnetic field at the target, high sputtering rates can be achieved while at the same time effecting high target utilization due to the uniform sputtering thereof.

In all magnetically enhanced cathodes such as planar magnetrons, there are strict limitations to the size and shape of the target. In the ion source sputtering system of the present invention, target cooling and protection of the cooling coils are the only real size concern. A very large ion source can easily sputter a tiny target. If the target is very large relative to the source, the rate will be low, but the total quantity of sputtering is the same as for a smaller target. Because the target is not related to the magnetic field, there are not the same restrictions present as with planar magnetrons or the like. Thus the permeability of the target is unimportant. It is possible to direct the ion source into a nearly closed enclosure of target material and deposit on an isolated or + biased substrate from all directions simultaneously.

b. Plasma Bombardment

This application also involves considerations similar to those involved with respect to the cleaning of substrates. Hence, sputtering of either metals or non-conductors can be effected. Further, the target need not be electrically biased since no net current flow is involved. However, a negative voltage applied to the cathode may be of assistance in the case of conductive targets for ion acceleration. Further, an RF bias applied to the target may be helpful for non-conductive targets. Again, the plasma will sputter independent of target magnetic permeability.

3. Sputter Deposition With Ion Impingement a. Ion Bombardment

Referring to FIG. 13a, substrate 99 will be coated with the material sputtered from target 102 where + ion rich plasmas are preferred for a conductive target but where a neutral or electron rich plasma may be employed for either conductive or non-conductive targets. If a conductive target is used such as aluminum and if the + ions are generated from an inactive gas such as argon, the + argon ions may also bombard substrate 99 if it is appropriately biased. Thus, a combination of sputtered aluminum and + argon ions impinge on the surface of substrate 99. Assuming the substrate 99 is electrically conductive and appropriately biased, and assuming that the sputtered aluminum output rate is sufficiently greater than the + argon output impinging on the substrate, the substrate will be coated and ion bombarded. That is, as aluminum coats onto the substrate, the argon ions will bombard the coated substrate which provides increased reaction energy to back sputter or etch away any poorly bonded aluminum atoms of the coating. The resulting bond strength between the coating and substrate 99 is better than that attained by conventional sputtering or evaporation.

In conventional evaporation-ion plating, a coating material is evaporated toward a substrate and argon is simultaneously introduced close to the substrate. The substrate is then forced to negative potentials to establish a disharge about it. The argon ions created by the discharge then bombard the substrate to provide the desired back sputtering with the resulting ion plating. As can be seen in the present invention, the need for a separate bias voltage source is obviated although the substrate should have appropriate bias applied thereto. This bias will be between the voltage of the anode and cathode, so it can be obtained easily from that power supply, or can be obtained by adjusting the plasma polarity as discussed below. Ion bombardment is used at the substrate, but no discharge, per se, is needed there, as it is in conventional ion plating.

b. Plasma Bombardment

Sputter-ion impingement of non-conductive substrates or electrically isolated conductive substrates can also be effected by bombarding the substrate (and target) with an electrically neutral or electron rich plasma. + argon ion build-up on the substrate (and target) will be neutralized by the electrons present in the plasma. Hence, sputter-ion impingement of electrically non-conductive substrates can be effected.

In order to effect sputter-ion impingement with either + ion or plasma bombardment, the sputtered aluminum output rate must be greater than the rate of plasma etching applied to substrate 99. If it is not, the + argon ions will etch away the aluminum as fast as it can be deposited on surface 99. In fact, there can be significant etching of the substrate during the procedure. This will be further discussed below.

4. Selective Sputter Deposition/Sputter Cleaning

Depending upon the electrical conductivity and electrical potential of the substrates 112 and 114 of FIGS. 13-15, they can be selectively sputtered or etched. For example, if generator cathode 23 is at ground potential and the output is both aluminum being sputtered from target 102 and Ar+ ion rich plasma from the ion source and if substrate 99 is conductive and grounded, it will etch. If it is non-conductive, it will coat with aluminum. The reason for this is that in an ion rich output, insulating surfaces will quickly charge to a + voltage that is equal to the energy of the + ions in the source output at that chamber location. Once it has been established, this positive potential prevents + ions from striking these surfaces, and thus the etching caused by + ion bombardment stops. However, because the source output includes neutral atoms of aluminum sputtered from the target, this metal plates on insulating surfaces and typically on all of the rest of the system interior. On the grounded metallic surfaces, however, no + charge can accumulate and ion bombardment continues full force, sputtering (etching) away the aluminum as fast as it can arrive. Thus, there is no accumulation of aluminum on these surfaces. In fact, they can be significantly etched during the reaction. In a test which was conducted in a copper coated chamber, aluminum was plated on plastic parts, windows, and other dielectrics and simultaneously the copper was cleaned from the walls of the chamber coating, and added to the dielectrics.

If the potential of the generator cathode is changed to below ground and the output to electron rich, then plastic surfaces charge negatively and selectively attract the + ions. In this mode, dielectric surfaces can be selectively etched rather than coated. For conductive substrates, their voltage can be adjusted such that they either coat or etch. Making them positive leads to coating, negative etches them. Dielectrics or electrically isolated metal substrates coat or etch depending primarily in the + ion/electron ratio in the source output where a + ion rich output leads to coating and an electron rich or neutral output leads to etching.

Using these techniques a metal in contact with dielectrics can be selectively coated, keeping the dielectrics clean. Thus, assuming substrate 99 of FIG. 13a is metallic and assuming carrier 97 is dielectric, the source 16 may be made electron rich and substrate 99 runs at + voltage. There are problems associated with the opposite situation, namely coating a dielectric and etching the metal in contact with it. The dielectric quickly charges opposite in polarity to the metal and an arc like discharge is established between them. The conductive coating being placed on the insulator tends to concentrate the voltage gradient at the edge of the conductor, creating violent discharge there.

As stated above, all of the foregoing is subject to the relationship between sputtered metal output rate and plasma output of the source. If the system is in an etch mode but has a greater sputter output than etch capability, then the substrate is sputter-ion impinged.

For certain purposes, the embodiments of FIGS. 13-15 have been considered above as combined sputter deposition/sputter cleaning sources. In these embodiments, the sputter deposition source (that is, target 102) is separated from plasma source 16. This separation of the sources is avoided in the embodiment of FIG. 20. The combined source 124 includes a sputter target cathode 126 which is not covered by generator anode 20 and which does not have magnetic lines of force entering or exiting perpendicular therefrom. Thus, the output from source 124 will be a combined output of the neutral atoms sputtered from target 126 and plasma, the plasma being produced in the same manner as that produced by plasma generator 16. A collector electrode (not shown) may be used to selectively remove either electrons or +ions from the ejected plasma. Hence, the combined sputter/etch source of FIG. 20 may be employed in the same manner as those of FIGS. 13-15 for selective coating and etching or sputter-ion impingement, etc.

5. Reactive Sputter Deposition

In reactive deposition processes, an active gas or ions thereof contacts the sputtered material whereby a compound of the sputtered material and the active gas are formed on the substrate as is well known. Referring to FIG. 13a and assuming that the active gas is present between substrate 99 and target 102, +ion or plasma bombardment of the target will result in even target erosion. Thus, there are no areas where the reacted target tends to have a different behavior from the remainder of the target. Hence, high target utilization and sputter rates can be provided even in reactive applications.

Assuming the plasma generated by source 16 is that of an active gas and assuming electrons are removed therefrom by collector electrode 30, an active ion bombardment of the sputtered layers deposited on substrate 99 occurs thereby helping to guarantee the stoichiometry of the reaction. This process thus involves reactive sputter-ion impingement and corresponds to the sputter-ion impingement process described above, the only difference being that ions of a reactive gas are used rather than those of an inert gas. This application permits reactions that require considerable surface energy such as the formation of CrN, MoN and other nitrides.

Prior attempts to create such compounds as CrN and MoN by sputtering the metals in the presence of a partial pressure of $N_2$ were not effective using a conventional magnetron cathode because the activation energy needed for formation of these nitrides is higher than that provided by the dynamics of the reaction present. If the $N_2$ partial pressure is increased sufficiently to cause reaction, sputter rate is decreased until, in the limit of 100% $N_2$ pressure, the sputter rate is reduced to zero. Thus, in order to bring about reactions, high substrate temperatures must be maintained. In contrast, by using the inverse magnetron ion source of the present invention, nitride formation can be very readily achieved over a wide range of $N_2$ partial pressures with cold substrates. In fact, effective sputtering for many metals can be achieved using only nitrogen, i.e. argon is not needed. The implication of this is that the conventional magnetron does not impart the full applied voltage to the ions bombarding the target, whereas the inverse magnetron of the present invention provides the energy needed for nitrogen sputtering and for formation of these nitrides.

When the output of source 16 impacts both substrate 99 and target 102, both of the above described advantages can be achieved—that is, reactive ions directed to the target provide uniform sputtering and high sputter rates thereof while the reactive ions directed to the substrate provide reactive sputter-ion impingement thereat. In fact, a novel feature of the present invention resides in the fact that reactive ions can be used to sputter targets and yet high sputter rates can be achieved.

Further, a combination of both active and inert ions may be directed at both the target and/or substrate. Such a combination of ions may be produced by feeding both active and inert gases into plasma source 16, although it is to be understood in all embodiments of this invention that the gas(es) to be ionized may be introduced elsewhere in the system such as adjacent target 102 since the gas may be used for other purposes. When ions (active and/or inert) are directed to both the target and substrate, the target voltage vs. substrate voltage will determine the relative energies.

6. Surface Reaction Without Simultaneous Sputter Deposition

The embodiments of FIGS. 16 and 17 may be utilized to provide a surface reaction at substrates 112 and 114 with an active gas which may be introduced adjacent the substrates. If, in FIG. 16, the collector electrode 30 is disconnected from the power supply to provide neutral output, or negatively biased to provide a negative inert gas plasma bombardment of the substrates, surface energy is provided at the substrates to induce chemical reactions with the reactive gases. There is no need to provide an electrical connection to the substrate nor need it be conductive.

If a + argon ion rich bombardment is provided by the embodiments of FIG. 15 or 16, there will again be provided surface energy to induce chemical reactions. However, the substrate must be electrically conductive in this instance if D.C. power is to be applied thereto. Non-conductive substrates may be employed if RF is applied thereto.

If the reactive gas is present in plasma source 16, the surface energy required at the substrate will be provided by bombarding reactive ions where the ions will chemically combine with the material of the substrate. Argon or the like need not be present in the plasma source although it may. Electrical contact of the substrate is not required nor is substrate conductivity.

If the substrate is bombarded with a plasma rich in + ions of the reactive gas, the same reaction occurs as that described above for bombardment with the neutral or electron rich, reactive gas plasma. In this instance, electrical conductivity of the substrate is needed or else RF must be used. Further, electrical contact to the substrate is also needed.

In either reactive sputter deposition or surface reactions without sputter deposition, there is the possibility of some sputtering of generator cathodes. Thus, it is desirable that these be of the metal involved in the surface reaction. In this way, any accidental sputtering of these surfaces will not contaminate the coating.

The possibility of sputtering of the generator cathodes 22 and 24 has been discussed hereinbefore with respect to FIGS. 5(e) and 5(g). In the FIG. 5(e) embodiment, there may be sputtering of cathode surfaces 22 and 22'. This was at least an order of magnitude less than with a conventional magnetron, but was a predicted effect of the interaction of the two sides. To minimize this type of interaction, the source of FIG. 5(g) may be employed. Now all of the output can be directed toward the substrates. This double V cross-section throws a very wide pattern. Correct spacing apart of the two sides permits at a fixed source to substrate distance a quite uniform plasma density.

In some applications, it will still be desirable to have some sputtering of generator cathode surfaces to maintain clean surfaces as material is sputtered off of the substrates.

7. Combination Cleaning and Coating Cathode

Figure 21:
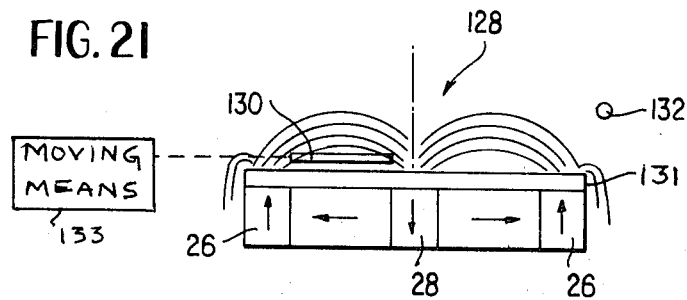
FIG. 21 is a diagrammatic illustration of an illustrative embodiment for cleaning and coating a substrate with a single source.

The 180° cathode-cathode relationship of FIG. 21 is similar to conventional planar magnetron sputter cathodes except for generator anode 130 under the sputter active parts of the line of force loop. This configuration is also shown in FIG. 5(g). Thus, the placement of an appropriately shaped anode such as generator anode 130 close to target 131 of a conventional planar magnetron sputter cathode converts it to a plasma source. It is also desirable that the ground reference of the conventional cathode be changed from the anode to the cathode so that the resulting Ar+ ions have high energy relative to grounded substrates.

Moving means 133 may be provided to alternately move anode 130 over and away from target 131. Thus, unit 128 may either be a plasma source for cleaning substrates, for example, or when anode 130 is moved away from over target 131, it may be a conventional planar magnetron sputter source for coating a substrate—all in the same cathode structure. If the usual anode structure 132 for sputtering is correctly located, and is operated during the cleaning cycle, it will separate electrons from the plasma discharge to give an Ar+ bombardment of the substrates.

It should be noted that optimizing unit 128 for both functions tends to generate a conflict. The plasma source needs large cathode areas that do not sputter, and the reverse is true for the sputter source. However, the presence of both functions for essentially the cost of one is desirable in some applications.

Figure 13B:
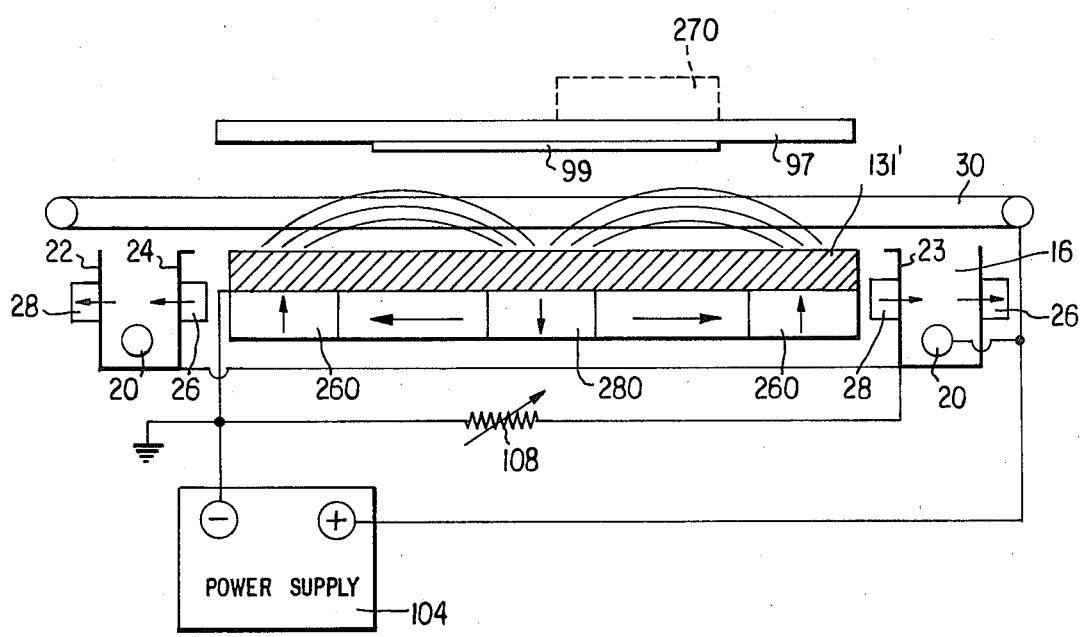

The disadvantages of attempting to optimize unit 128 are overcome by the structure shown in FIG. 13(b) which combines a conventional magnetron in place of target 102 in the apparatus of FIG. 13(a). More specifically, a conventional magnetron comprising a sputter target 131' and magnets 260,280 is positioned within the ion source. A separate anode is not provided for the magnetron. Instead, the anode 20 of the ion source acts as the anode for the magnetron.

A particular advantage of this structure is that there is significant sputtering from the magnetron cathode 131' when the ion source is operating, even when the magnetron is grounded as shown in FIG. 13b. There is heavy sputtering at the magnetron cathode 131' but not at the remainder of the chamber which is also grounded. The chamber walls which normally heat strongly from the ion source, now remain cool. The FIG. 13b apparatus permits several applications not easily accomplished before. For example, a plurality of different metal targets can be mounted on a grounded moveable surface so that the different targets can be selectively moved over the magnet structure 260,280. In this way, alloy generation in any desired ratio can be readily accomplished. Alternatively, the magnet structure can be moved under each target, of if electromagnets are used, the electromagnets can be selectively energized under each target. In either case, an alloy of desired ratio will be sputtered onto substrate 99.

The same principle can be used for cleaning restricted areas. For example, if it were desired to clean a selected area of the chamber walls, this could be accomplished by applying an appropriate magnetic field to that area. In this application, the conventional magnetron structure would be removed, or at least not magnetically energized in the FIG. 13b apparatus. This same principle of magnetic localization also permits localized cleaning action to the substrate 99. In this application, the substrate carrier 97 is grounded, with the rest of the assembly, and a magnet structure generally indicated by the dotted line 270 is positioned adjacent the carrier opposite the area to be cleaned on the substrate. In an in-line system where the grounded substrate carrier is moved in and out of the chamber, the magnet structure 270 should be electrically isolated, as by an electrically appropriate insulator. Thus, when the grounded substrate carrier 97 is moved resulting in the magnet structure being exposed to the + ions from the ion source, the magnet structure will quickly charge positively and stop any significant sputtering of the magnet structure itself. The convenience of a grounded target is very significant because it permits convenient moving magnets and other methods of establishing high target utilization.

In the FIG. 13b embodiment, the ion source 16 is used directly as the anode for the magnetron. Normally, the anode functions for the magnetron are thought of as primarily the establishment of the electrostatic field and the collection of electrons to complete the current flow. However, due to the unexpected full pseudo-cathode behavior of the source cathodes, it is possible to connect the ion source as a simple anode, that is, connect only anode 20 to the + side of power supply 104 and yet obtain compound functions. In addition to the above listed functions, the ion source provides ions which, because they come from beyond the dark space, are super effective in sputtering. Those ions fall through essentially the entire applied voltage as they strike the cathode. Because of this improved ion energy, the sputter rates are several times those usually obtained with a magnetron having conventional anodes. Thus, in the FIG. 13b embodiment, a major portion of the ion generation function has been transferred from the immediate vicinity of the magnetron cathode to that of the anode. As a result, the function of the magnetron field has also changed. The field remains an electron trap, but the circulating current is less important in creating ions. The trapped electrons now appear to play primarily an electrostatic role rather than an ion producing role.

As previously mentioned, the ion source can be run with only "pseudo" cathodes; that is, with only insulators where the generator cathodes would be ordinarily. In this configuration, an oscillation between the normal magnetron mode (electron rich) and the normal ion source mode (ion rich) has been detected. The change in mode seems to be caused by the pseudo cathode areas becoming too positive in voltage. It is possible to detect this oscillation between modes by means of a detector electrode which provides a changing indication of sensing a positive voltage (ion rich) to sensing a negative voltage (electron rich) and vice versa. The change in mode has a time constant of about one second, suggesting a restructuring of charge structure throughout the system. In one experiment, a magnet was brought close to the system wall with the result that the brightness of the discharge increased, the power increased and the power focussed on where the magnetic field provided electron trapping. The system then stabilized with the one second time constant. When the magnet was removed, the reverse behavior was observed.

From the foregoing observations, it may be concluded that the ion source generates an intense plasma which fills the chamber. Even though a high energy plasma fills the chamber, the ion source is not shorted to the return current connection. The reason for this may be explained in terms of the equivalent electrolysis problem, namely polarization. Polarization is very simply the local depletion of charge carriers such that current can flow only as fast as diffusion or other transport mechanism brings charge carriers into the depleted area. At the negative electrode area, be it chamber wall or smaller surface area, the highly conductive plasma brings the high energy ions quite close to the surface; however, there are still sufficient electrons in the plasma so that it is nearly neutral. On the other hand, there is a strong voltage gradient at the cathode surface, and in the gradient area, electrons are repelled from the surface and positive ions are accelerated toward it. The result is an area quickly cleared of charge carriers. Because the plasma is very conductive, the gradient cannot extend into it too deeply. Where there is no gradient, there can be no large current flow. In the depleted area, there is a high voltage gradient but no charge carriers. Diffusion mechanisms then play a role in getting charge carriers into this current controlling area.

Like the electrolysis case, current can be increased by any means that will shorten the polarization layer thickness. The looping magnetron magnetic field traps electrons in the vicinity of the magnetron cathode surface. The plasma in turn provides positive ions to neutralize the charge of the trapped electrons with the result that the intense plasma moves closer to the magnetron cathode, shortening the polarization layer and permitting very high currents to flow with high energy ions striking the target.

The control of the polarization layer then becomes the mechanism by which cleaning, etching and sputtering is controlled using an ion/plasma generating anode system. Some of the techniques that may be employed to break the polarization barrier are:

1. Shortening the voltage gradient by moving the plasma by
   a. gas motion,
   b. crossed field plasma pump (A.C. for non-conductive targets), and
   c. restricted generator volume;
2. Shortening the voltage gradient magnetically by
   a. magnetron field to create an electron trap,
   b. modified magnetron field, and
   c. auxiliary electron source with magnetic transport to target (for non-conductive targets); and
3. Pulsing to discharge the voltage gradient.

It should be noted that the system cleaning by the normal conduction across the gradient is, significant, representing fair sputter rates for conductors. Current measurements show that the plasma energy is very uniformly distributed to all conductive areas of the flat chamber walls. The current is multiplied at edges and small diameters. The amount of power that can be dissipated per unit area depends on the plasma density and the degree of polarization. Thus, increasing the power to the ion source will increase the power density at the magnetron cathode, and independently increasing the negative voltage on a given area may slightly increase the current. The normal state seems to be rather highly polarized, so the added voltage tends to not be very effective.

8. Clean Up of Waste Materials

In some cases it may be necessary to provide a large anode potential (or floating if the source is + ion rich) surface 91 (FIG. 16) to collect the waste material so that it cannot be re-sputtered. Such a configuration tends to cause the bombardment to be primarily + ions. This presents a possible problem with non-conductive substrates, but provides a unique cleaning technique for grounded conductive substrates.

Figure 23:
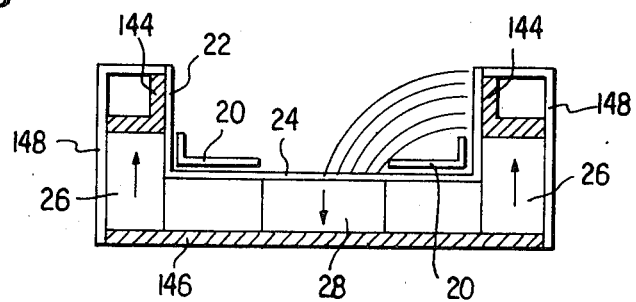
FIG. 23 is a diagrammatic illustration of an illustrative heat source.

This has been demonstrated in a test of the low heat rise device shown in FIG. 23, which device will be described in further detail below. The chamber had been used for a number of hours of coating using aluminum and copper prior to this demonstration. The source was then operated at about 1000 watts for a maximum of 20 minutes. It was then discovered that the grounded walls of the vacuum chamber (not shown) containing the source of FIG. 23 was almost totally cleaned back to shiny clean stainless steel. Corners and edges were the cleanest. The cleaning far exceeded the quality, at least vacuum-wise, that could be achieved by most methods. The windows, plastic parts and other uncovered insulators were deeply coated due to the + ion rich output of the source. In the embodiment of FIG. 16, surface 91 (which may float with respect to ground assuming the output of the source is + ion rich) is employed to collect the waste material cleaned from the substrates. This is the same function as performed by the insulative collecting surfaces of the FIG. 23 embodiment. After the clean-up operation, plate 91 may be removed and cleaned, if necessary, or replaced.

The substrate cleaning technique using the source 10 of the present invention is an important application thereof. Thus, a commercial coating system can be cleaned after an 8–22 hour day's operation by running 1–2 hours with source 10. Hence, many days/years of maintenance time can be eliminated.

The foregoing cleaning of the chamber walls was not expected in that when ions move an appreciable distance through a gas medium there are many collisions of the ions with gas molecules decreasing the ion energy. Low energy bombardment of the walls will heat them—as observed—but should not sputter them. The fact that very marked sputtering occurred leads to the conclusion that very energetic ions were bombarding the surface. Secondly, there appeared to be sputtering from the walls that was much greater in magnitude than can be accounted for on the basis of the direct output current from the ion source.

High energy at the system wall implies a significant voltage gradient near that surface. This was not expected due to the huge area of that surface in comparison with the very small anode in the ion source. Measurements of + ions energy show that energy is lost as one moves away from the source. As each ion strikes neutral argon molecules it will, if still sufficiently energetic, create an additional new + ion and free an electron. The possibility of each initial argon ion generating up to about ten ions and electrons is present. This can provide a large current of + ions at low energy. If these ions then fall through a voltage gradient that creates sputtering at the cathode (system) surface, one can account for what was observed. What happens to the electrons from this secondary generation has not been determined. However, it is thought they also somehow get to the chamber wall such that this secondary current of ions and electrons does not get to meters in circuit with the wall. The fact that the quantity of material moved is many times that conventionally sputterable by magnetron forces such a conclusion.

Although there is no intent to be limited to the foregoing theory of operation, the new technology of this invention could increase the sputter rates by a major factor by a very different principle than previously applied. Magnetron sputtering accomplished a decade multiplication of effectiveness over diode sputtering. Now this system appears to provide a similar multiplication of the magnetron in addition to increasing target utilization, etc.

Cascase generation is perhaps a parallel in radiation physics. Here a high energy radiation impinges on matter and dissipates its energy by creating a larger and larger number of lower and lower energy particles. The present invention appears to differ in being able to then re-accelerate this larger number of charged particles to do the sputtering. This ionization multiplication effect becomes a major consideration with the plasma/ion source. With this it may be possible to provide many times the cleaning, coating, reacting, sensitizing, etc. that are possible by most other methods.

9. High Value Or Dangerous Target Material Retrieval

The collection of clean-up material as discussed above has two or more very significant applications. The retrieval of gold and other expensive target materials can be achieved via the ion cleaning technique discussed. This does not separate the individual materials from each other, but permits one to concentrate to small retrieval surface 91 the previously scattered materials. The retrieval of dangerous materials can be done this same way. Note in this application, surface 91 is small and thus the collection of the expensive or dangerous material will taken longer than the collection of waste material as described above. However, it will be more concentrated. This method of system cleaning is unique in its manner of self cleaning and retrieving the collected material. This one aspect moves the percent retention of critical materials to a very good figure. As we enter an era of great concern over pollution, especially with radioactive materials, poisonous metals, etc., the introduction of a faster deposition method with full built-in cleanup is very advantageous.

10. Heating a. Substrate Heating

Heating of substrates 112 and 114 of FIGS. 16 and 17 by plasma bombardment provides cleaning and heating thereof simultaneously. Electron bombardment may be effected by applying negative high voltage to cathode 23 and collector electrode 30 to remove + ions. The electron energy can provide non-sputtering fast heat transfer to conductive substrates 112 and 114. Tungsten filaments can provide higher electron yields, but with resultant tungsten contamination.

b. In general

As discussed hereinbefore with respect to FIGS. 7(b) and 7(c), the plasma source of this invention may comprise a heat source in which little heat is lost in the source. The structure shown in FIG. 23 has demonstrated unique properties of very cool operation of both anode 20 and cathode 23. yet its plasma and + ion output quickly heated the metal vacuum chamber (not shown) containing it and cleaned the chamber's inside surfaces, as discussed above. Crude calculation of the energy retained in the structure suggest that better than 80% efficiency was obtained. A small collector (not shown) a few inches from the front of the source established a voltage of +100 volts and when maintained at ground potential entertained 0.2 amperes when the total source current was 2 amperes at 500 volts. Thus, there was a net + ion flow from this source even without an external anode, the net + ion flow occurring because of the facing relation of the generator cathodes. Application of a negative bias on a collector electrode (not shown) increased the current there to 1.5 amps at about 400 volts. Magnet 26 was in contact with L-shaped pole piece 144 while magnets 26 and 28 were coupled with pole plate 146. Insulator 148 was disposed about the magnetic structure.

11. Pumping

Figure 22:
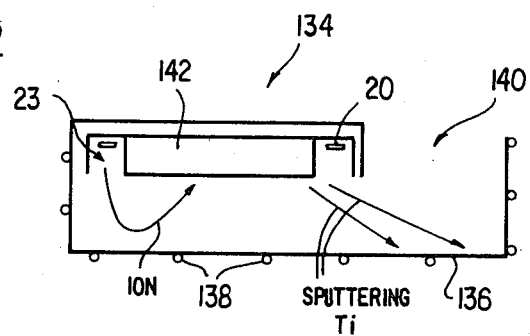
FIG. 22 is a diagrammatic illustration of an embodiment for pumping active gases.

Some processes may employ the pump 134 of FIG. 22 for the selective pumping of reactive gases, such as $O_2$, $N_2$, $H_2O$, $CO_2$, etc. The use of a sputter cathode 142 aimed at a shield 136 cooled via pipes 138 provides very fast pumping of these materials if the target is titanium, for example. In the roll coating industry, the foregoing arrangement makes possible a narrow, very long pump that can extend across a web to pump the outgassing products, unreacted process gases, etc.

12. Sensitization

Also in the roll coating industry there is a need to provide activation or sensitization of the materials prior to their being coated or bonded by any of the available methods. This activation or sensitization can also be achieved by the sources of FIGS. 16 and 17 with their unique capacity for being adjusted over a range of outputs from electrons through neutral plasma to positive ions.

13. Charge Elimination

The source of FIGS. 16 and 17 is also useful in roll coating to discharge built-up charges on the film. Typically these can discharge to the roller mechanism at the edges of the film, destroying the film there. Because a sputter cathode typically discharges electrons to the substrate, a + ion rich source of rather low energy can be used to bring neutrality to the roll.

14. 360° Coating Applications

Figure 24:
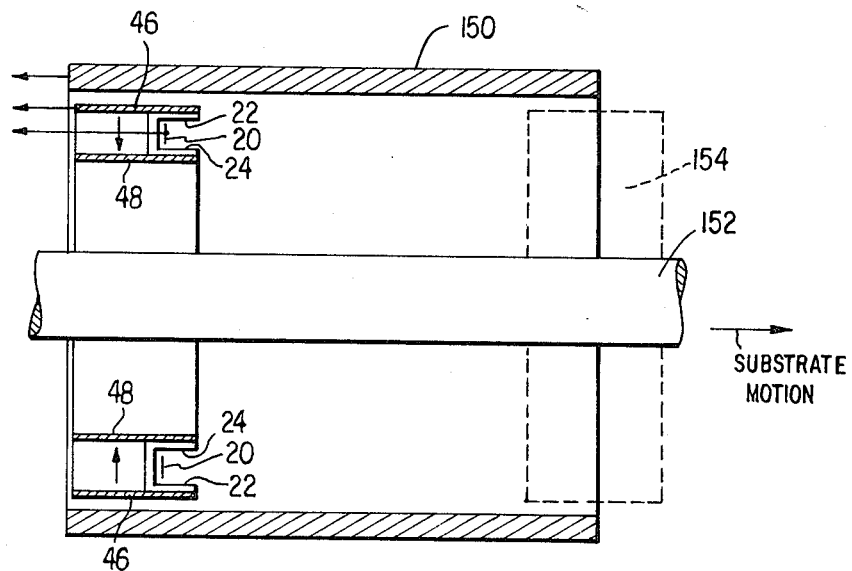
FIG. 24 is a cross-sectional view of an illustrative device for 360° coating applications.

For the application of coating wire or other 360° coverage items, a practical approach is to take the FIG. 2(c) source and close it on itself such that steel walls 46 and 48 become concentric rings as shown in FIG. 24. The target 150 is a tube big enough to hold the ion source assembly thereby providing a symmetrical tubular sputter source with no primary blockage caused by a substrate 152 moving down the center of the tube. Moreover, it is possible to move the ion source assembly, or the tubular target, to most effectively utilize the target, length by length. Alternatively, a second tubular target in the center, in place of the substrate 152, would cause the device to provide an output ring of sputtered material. A sharpened center rod of target material and an adjustable position for the ion source would provide a degree of focusing of the output on a substrate 159. Such a device is useful in hard surface treatment wearring applications where a nitride, oxide or carbide, for example, could be applied, especially after mechanical finishing, to give added life time. One of the biggest of such applications is in the valve seals of internal combustion engines.

In the description of FIG. 1, the ion source according to the invention was termed an "inverse magnetron". The characteristics of this device may be summarized as follows:

1. The device must have an electron source since it will not operate without electrons. Generally, this is provided by the cathode surfaces 22,24 shown in FIG. 1, for example, but many other electron sources such as filaments, beta particle sources, hollow cathodes and UV illumination of cathode surfaces can be used. In fact, the use of such sources is mandatory when both cathode surfaces 22,24 are "pseudo cathode" surfaces.

2. The device must have cathode potential electrical field forming elements. This is necessary to establish the crossed field electron trap.

3. The device must have an anode to establish an anode potential.

4. Magnetic field lines must be formed in the device generally perpendicular to the cathode surfaces and generally parallel to the anode surface. The magnetic field, of course in combination with the electric field, forms the crossed field electron trap. If the magnetic field is not perpendicular to the cathode surfaces, the cathode surfaces will sputter. This may, however, be permissible in some cases. If the magnetic field is not parallel to the anode and/or the same field lines cut at each end, energetic electrons reach the anode, heating it and lowering the device efficiency. While not desirable, some decrease in device efficiency can be tolerated in practical embodiments.

5. The device is generally open perpendicular to the exposed anode or there are uncut lines of force over the same. This open aspect of the device allows electrons, plasma or ions to escape. The opening must be opposite the anode which repels ions, unless there are means for deflecting the ions.

The ion sources of the invention might be likened to Penning electron traps which have been opened, spaced, tipped or inverted such that the anode faces the direction that ions are expelled. This may be better appreciated when it is realized that the first four characteristics listed above are basically Penning. This is best seen by reference to FIG. 25(a) which shows the basic Penning cell comprising cathode surfaces 160, 162 and tubular anode 164. The fifth characteristic is the critical difference and results in the inverted cell shown in FIG. 25(b). In this figure, the tubular anode 164 is replaced by a rod anode 166, and the open aspect of the device is clearly evident when contrasted with the conventional Penning cell.

Figures 25A, 25B:
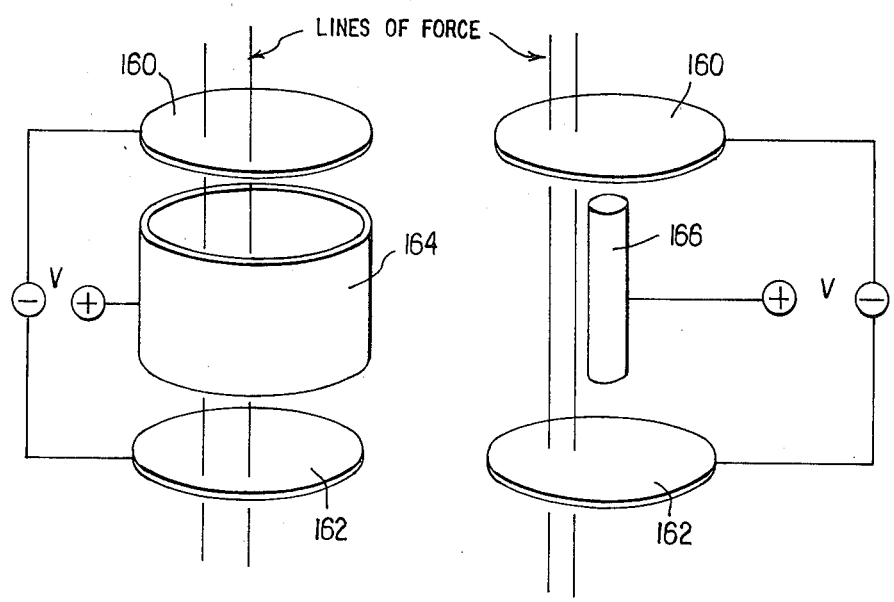
FIGS. 25(a) and 25(b) are, respectively, pictorial illustrations of a conventional Penning cell and an inverted cell according to the invention.

The inverted cell shown in FIG. 25(b) illustrates yet another practical configuration of the ion source of the invention. Most of the embodiments, especially those illustrated in FIG. 5, are generated by rotation about an axis that is at a distance from the basic structure. The reason for this is that there must be room in the center to develop a magnetic field. However, in this embodiment shown in FIG. 8, the basic structure illustrated can be rotated about its central axis.

As previously mentioned, it is possible, and in some instances mandatory, to use electron sources other than the cathode surfaces 22, 24. The hot filament is one of the best such sources in that it is capable of very high electron currents. However, it does provide some tungsten contamination and has a rather finite life time. Nevertheless, the use of a filament at the correct end of an ion source that is not a closed loop achieves full output with almost no regeneration length. The use of an auxiliary filament may be required in those cases where emission from the cathode surfaces 22, 24 are not sufficient to meet the current requirements. Excessive electron emission changes the source output to negative and thus can be effectively used as an alternative polarity control mechanism. In addition, the use of a filament permits lower pressure operation.

In the foregoing embodiments, permanent magnets for use as magnets 26 and 28, for example, preferably may constitute stacks or coils of magnet strips such as that ferrite impregnated plastic or rubber tapes sold by Minnesota Mining and Manufacturing Co. under the PL-1.4 H designation. Such stacks or coils are illustrated, for example, in U.S. Pat. Nos. 4,162,954 and 4,180,450, which are assigned to the present assignee and which are incorporated herein by reference.

It is to be understood that the above detailed description of the various embodiments of the invention is provided by way of example only. Various details of design and construction may be modified without departing from the true spirit and scope of the invention as set forth in the appended claims.

What is claimed is:
1. Sputtering apparatus comprising
   at least one element to be sputtered;
   at least one plasma source for generating a plasma from at least one ionizable gas where at least some of the charged particles of the plasma sputter the element, said plasma source including
      first and second electrostatic field defining surfaces at approximately the same potential;
      means for generating a magnetic field having lines of force which pass through said first and second electrostatic field defining surfaces;
      a generator anode disposed adjacent that portion of the magnetic field between said first and second electrostatic field defining surfaces;
      means for establishing an electric field between the generator anode and said first and second electrostatic field defining surfaces where at least portions of the electric and magnetic fields are substantially perpendicular to one another
   whereby said plasma is formed between said first and second electrostatic field defining surfaces and ejected away from the generator anode.

2. Apparatus as in claim 1 further comprising means for supplying electrons to the space between said first and second field defining surfaces.

3. Apparatus as in claim 2 wherein said means for supplying electrons is coextensive with at least one of said first and second field defining surfaces.

4. Apparatus as in claim 2 wherein at least one of said first and second electrostatic field defining surfaces is electrically isolated from the rest of the apparatus and accumulates a negative charge during sputtering due to electrons accumulating on the surface thereof in the presence of said magnetic field.

5. Apparatus as in claim 4 wherein both of said first and second electrostatic field defining surfaces are electrically isolated from the rest of the apparatus.

6. Apparatus as in claim 5 wherein said means for supplying electrons is a filament.

7. Apparatus as in claims 4 or 5 wherein said at least one of said first and second electrostatic field defining surfaces is an insulator.

8. Apparatus as in claims 4 or 5 wherein said at least one of said first and second electrostatic field defining surfaces is conductive.

9. Apparatus as in claim 1 wherein said element includes a target of coating material and where said apparatus includes a further element including a substrate upon which the coating material of the target is to be deposited.

10. Apparatus as in claim 9 wherein said target is the cathode of a planar magnetron, said planar magnetron including further means for generating a magnetic field having lines of force which pass through said target.

11. Apparatus as in claim 10 wherein said target is divided into a plurality of areas each with a different coating material, and said planar magnetron selectively generates a magnetic field having lines of force which pass through each area of said target according to a predetermined sequence thereby depositing the different coating materials on said substrate according to a predetermined ratio.

12. Apparatus as in claim 9 wherein said first and second field defining surfaces are concentric cylindrical surfaces.

13. Apparatus as in claim 12 wherein said target element is cylindrical and coaxially surrounds said first and second field defining surfaces, and said substrate element is elongated and has a common axis with said target element.

14. Apparatus as in claim 13 wherein the combination of said target element and said plasma source is moved along the axis of said substrate element to provide a uniform coating of target material over the surface of said substrate element.

15. Apparatus as in claim 13 wherein said substrate element is drawn through the center of the combination of said target element and said plasma source to provide a uniform coating of target material over the surface of said substrate element.

16. Apparatus as in claim 15 wherein said substrate element is wire.

17. Apparatus as in claim 12 wherein said target element is rod-shaped and has a common axis with said first and second field defining surfaces, and said substrate element is positioned in a plane perpendicular to said common axis.

18. Apparatus as in claim 1 further comprising second means for generating a magnetic field having lines of force which pass through said element, and second means for establishing an electric field between the generator anode and said element where at least portions of the electric and magnetic fields are substantially perpendicular to one another.

19. Apparatus as in claim 18 wherein said element is a substrate to be cleaned.

20. Apparatus as in claim 1 wherein said first and second field defining surfaces are circular and located on parallel planes with their centers on a common axis which perpendicularly intersects said parallel planes, and said generator anode is rod-shaped having an axis congruent with said common axis.

21. A sputtering method comprising the steps of providing at least one element to be sputtered;
providing a plasma source for generating a plasma from at least one ionizable gas where at least some of the charged particles of the plasma sputter the element and where the plasma is generated by the steps of establishing first and second electrostatic field defining surfaces at approximately the same potential;
generating a magnetic field having lines of force which pass through said first and second electrostatic field defining surfaces;
providing a generator anode disposed adjacent that portion of the magnetic field between said first and second electrostatic field defining surfaces;
establishing an electric field between the generator anode and said first and second electrostatic field defining surfaces where at least portions of the electric and magnetic fields are substantially perpendicular to one another
whereby said plasma is formed between said first and second electrostatic field defining surfaces and ejected away from said generator anode.

22. The method according to claim 21 further comprising the step of controlling the polarization layer adjacent the surface of said element to be sputtered to thereby permit high energy ions in said plasma to strike said element.

23. The method according to claim 22 wherein the step of controlling said polarization layer comprises the step of generating a second magnetic field having lines of force which pass through said element.

24. The method according to claim 23 wherein said element includes a target of coating material and further comprising the step of providing a further element including a substrate upon which the coating material of the target is to be deposited.

25. The method according to claim 24 wherein said target is divided into a plurality of areas each with a different coating material, said step of generating said second magnetic field being performed by selectively generating said second magnetic field so that lines of force pass through each area of said target according to a predetermined sequence thereby depositing different coating materials on said substrate according to a predetermined ratio.

* * * * *